(12) United States Patent
Li et al.

(10) Patent No.: US 12,058,905 B2
(45) Date of Patent: Aug. 6, 2024

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Gen Li, Beijing (CN); Huijuan Yang, Beijing (CN); Pinchao Gu, Beijing (CN); Yuqian Pang, Beijing (CN); Jingwen Zhang, Beijing (CN)

(73) Assignees: Chengdu BOE Optoelectronics Technology Co., Ltd., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 502 days.

(21) Appl. No.: 17/413,063

(22) PCT Filed: Aug. 3, 2020

(86) PCT No.: PCT/CN2020/106576
§ 371 (c)(1),
(2) Date: Jun. 11, 2021

(87) PCT Pub. No.: WO2022/027177
PCT Pub. Date: Feb. 10, 2022

(65) Prior Publication Data
US 2022/0310748 A1    Sep. 29, 2022

(51) Int. Cl.
*H10K 59/131* (2023.01)
*G09G 3/3233* (2016.01)
*H10K 59/65* (2023.01)

(52) U.S. Cl.
CPC ......... *H10K 59/131* (2023.02); *G09G 3/3233* (2013.01); *H10K 59/65* (2023.02);
(Continued)

(58) Field of Classification Search
CPC ............. H01L 33/38–387; H01L 33/62; H01L 33/647; H10K 59/805–82; H10K 59/131; H10K 59/65
See application file for complete search history.

(56) References Cited

U.S. PATENT DOCUMENTS 10,490,620 B1    11/2019  Lai et al.
10,559,253 B1    2/2020   Li et al.
(Continued)

FOREIGN PATENT DOCUMENTS

CN    108469697 A    8/2018
CN    108520888 A    9/2018
(Continued)

OTHER PUBLICATIONS

International Search Report of PCT/CN2020/106577 in Chinese, mailed Apr. 20, 2021.
(Continued)

*Primary Examiner* — Evan G Clinton
(74) *Attorney, Agent, or Firm* — Collard & Roe, P.C.; William Collard

(57) ABSTRACT

A display substrate and a display substrate are provided. The display substrate includes a voltage bus line in the peripheral region, the voltage bus line at least partially surrounds the transparent region, and is configured to be connected with sub-pixels in a plurality of first pixel rows to provide a first voltage; the display substrate further includes a plurality of first signal lines extended along the first direction, and each first signal line includes a first signal line portion in the display region and a second signal line portion, which is electrically connected with the first signal line portion, in the peripheral region, and the second signal line portion includes a bent portion extended along the transparent region, bent portions of second signal line portions of the
(Continued)

plurality of first signal lines are all located at a side of the voltage bus line close to the transparent region.

19 Claims, 17 Drawing Sheets

(52) U.S. Cl.
    CPC ............... *G09G 2300/0852* (2013.01); *G09G 2310/061* (2013.01)

(56) References Cited

U.S. PATENT DOCUMENTS

| | | |
|---|---|---|
| 10,879,330 B1 | 12/2020 | Cui et al. |
| 10,916,595 B2 | 2/2021 | Park et al. |
| 10,964,761 B2 | 3/2021 | Lee et al. |
| 2013/0328840 A1 | 12/2013 | Fujikawa |
| 2019/0214600 A1 | 7/2019 | Park et al. |
| 2020/0058728 A1* | 2/2020 | Song ................... H10K 59/131 |
| 2020/0064968 A1 | 2/2020 | Kim et al. |
| 2020/0258952 A1* | 8/2020 | Bok ....................... H10K 59/88 |
| 2021/0013298 A1 | 1/2021 | Her et al. |
| 2021/0215983 A1 | 7/2021 | Ouyang et al. |

FOREIGN PATENT DOCUMENTS

| | | | | |
|---|---|---|---|---|
| CN | 108648627 A | 10/2018 | | |
| CN | 108831365 A | 11/2018 | | |
| CN | 108878455 A | 11/2018 | | |
| CN | 109087938 A | 12/2018 | | |
| CN | 109116636 A | 1/2019 | | |
| CN | 109300953 A | 2/2019 | | |
| CN | 109494243 A | * 3/2019 | ......... H01L 27/3276 |
| CN | 109727997 A | 5/2019 | | |
| CN | 109801947 A | 5/2019 | | |
| CN | 110264891 A | 9/2019 | | |
| CN | 110297365 A | 10/2019 | | |
| CN | 110459572 A | 11/2019 | | |
| CN | 110690254 A | 1/2020 | | |
| CN | 111123597 A | 5/2020 | | |
| CN | 111261032 A | 6/2020 | | |
| CN | 111402716 A | 7/2020 | | |
| JP | 2008216894 A | 9/2008 | | |
| KR | 20160003993 A | 1/2016 | | |
| WO | 2019199139 A1 | 10/2019 | | |
| WO | 2020036275 A1 | 2/2020 | | |

OTHER PUBLICATIONS

Notice of Transmittal of the International Search Report of PCT/CN2020/106577 in Chinese, mailed Apr. 20, 2021.
Written Opinion of the International Searching Authority of PCT/CN2020/106577 in Chinese, mailed Apr. 20, 2021.
International Search Report of PCT/CN2020/106576 in Chinese, mailed Apr. 29, 2021.
Notice of Transmittal of the International Search Report of PCT/CN2020/106576 in Chinese, mailed Apr. 29, 2021.
Written Opinion of the International Searching Authority of PCT/CN2020/106576 in Chinese, mailed Apr. 29, 2021.

* cited by examiner

DISPLAY SUBSTRATE AND DISPLAY DEVICE

CROSS REFERENCE TO RELATED APPLICATIONS

This application is the National Stage of PCT/CN2020/106576 filed on Aug. 3, 2020, the disclosure of which is incorporated by reference.

TECHNICAL FIELD

Embodiments of the present disclosure relate to a display substrate and a display device.

BACKGROUND

At present, display screen of display device is developing towards a direction of large screen and full screen. Generally, a display device (e.g., a mobile phone, or a tablet computer) has a camera (or an imaging device), and the camera is usually disposed outside the display region of the display screen. However, the installation of the imaging device requires a certain location, which is not conducive to the full screen and narrow frame design of the display screen. For example, the camera can be combined with the display region of the display screen, and a position is reserved for the imaging device in the display region to maximize the display region of the display screen.

SUMMARY

At least an embodiment provides a display substrate, comprising a display region, a transparent region and a peripheral region between the display region and the transparent region. The display substrate comprises a base substrate and a plurality of sub-pixels on the base substrate and in the display region, the plurality of sub-pixels are distributed into a plurality of pixel rows and a plurality of pixel columns along a first direction and a second direction, and the first direction and the second direction are different; the plurality of pixel rows comprise a plurality of first pixel rows separated by the transparent region; the display substrate further comprises a voltage bus line in the peripheral region, the voltage bus line at least partially surrounds the transparent region, and is configured to be connected with sub-pixels in the plurality of first pixel rows to provide a first voltage; the display substrate further comprises a plurality of first signal lines extended along the first direction, and the plurality of first signal lines are respectively connected with the plurality of first pixel rows in one-to-one correspondence; each of the plurality of first signal lines comprises a first signal line portion in the display region and a second signal line portion, which is electrically connected with the first signal line portion, in the peripheral region, and the second signal line portion comprises a bent portion extended along the transparent region; bent portions of second signal line portions of the plurality of first signal lines are all located at a side of the voltage bus line close to the transparent region.

In some examples, the display region comprises a first display region and a second display region which are separated by the transparent region and are opposite in the first direction, and the sub-pixels in the plurality of first pixel rows are separated by the transparent region and in the first display region and the second display region; the display substrate further comprises a plurality of first voltage lines and a plurality of second voltage lines extended along the first direction, the plurality of first voltage lines and the second voltage lines are all electrically connected with the voltage bus line; the plurality of first voltage lines are in the first display region and are respectively connected with rows of sub-pixels, located in the first display region, in the plurality of first pixel rows to provide the first voltage; the plurality of second voltage lines are in the second display region and are respectively connected with rows of sub-pixels, located in the second display region, in the plurality of first pixel rows to provide the first voltage.

In some examples, each of the plurality of sub-pixels comprises a light emitting element and a pixel circuit driving the light emitting element to emit light; the pixel circuit comprises a driving sub-circuit, a data writing sub-circuit, a compensation sub-circuit, a storage sub-circuit and a reset sub-circuit; the driving sub-circuit comprises a control terminal, a first terminal and a second terminal, and is configured to be connected with the light emitting element and control a driving current flowing through the light emitting element; the data writing sub-circuit is connected with the first terminal of the driving sub-circuit and is configured to write a data signal into the first terminal of the driving sub-circuit in response to a first scanning signal; the compensation sub-circuit comprises a control terminal, a first terminal and a second terminal, the control terminal of the compensation sub-circuit is configured to receive a second scanning signal, the first terminal and the second terminal of the compensation sub-circuit are electrically connected with the control terminal and the second terminal of the driving sub-circuit, respectively, and the compensation sub-circuit is configured to perform a threshold compensation on the driving sub-circuit in response to the second scanning signal; the storage sub-circuit comprises a first terminal and a second terminal, the first terminal of the storage sub-circuit is configured to receive a first power supply voltage, and the second terminal of the storage sub-circuit is electrically connected with the control terminal of the driving sub-circuit; the reset sub-circuit comprises a control terminal, a first terminal and a second terminal, the control terminal of the reset sub-circuit is configured to receive a reset control signal, the first terminal of the reset sub-circuit is connected with a corresponding first voltage line or a corresponding second voltage line to receive the first voltage, and the second terminal of the reset sub-circuit is connected with the light emitting element.

In some examples, the light emitting element comprises a first electrode, a second electrode and a light emitting layer between the first electrode and the second electrode, the first electrode is closer to the base substrate than the light emitting layer, and the voltage bus line and the first electrode of the light emitting element are in a same layer and insulated with each other.

In some examples, the storage sub-circuit comprises a storage capacitor comprising a first capacitor electrode and a second capacitor electrode, and the first capacitor electrode and the second capacitor electrode serve as the first terminal and the second terminal of the storage sub-circuit, respectively; the second capacitor electrode is at a side of the first capacitor electrode close to the base substrate; the first voltage line, the second voltage line and the first capacitor electrode of the storage capacitor are in a same layer and insulated from each other, and are located at a side of the voltage bus line close to the base substrate.

In some examples, the plurality of first signal lines are respectively connected with data writing sub-circuits of the sub-pixels of the plurality of first pixel rows in one-to-one correspondence to provide first scanning signals; the first signal line portion of each of the plurality of first signal lines comprises a first signal line sub-portion in the first display region and a second signal line sub-portion in the second display region, and the second signal line portion of each of the plurality of first signal lines electrically connects the first signal line sub-portion and the second signal line sub-portion of the each first signal line; the first signal line sub-portion and the second signal line sub-portion of each of the plurality of first signal lines are both extended along the first direction, the first signal line sub-portion is connected with sub-pixels located in the first display region in a first pixel row corresponding to the each first signal line, and the second signal line sub-portion is connected with sub-pixels located in the second display region in the first pixel row corresponding to the each first signal line.

In some examples, the first signal line sub-portion and the second signal line sub-portion of the first signal line are in a same layer and are at a side of the second signal line portion of the first signal line close to the base substrate.

In some examples, the display substrate further comprises a first connection electrode; the first connection electrode are at a side of the second signal line portions of the plurality of first signal lines away from the base substrate; the first signal line sub-portion and the second signal line portion of each of the plurality of first signal lines are respectively electrically connected through the first connection electrode; the first connection electrode is electrically connected with the first signal line sub-portion of a corresponding first signal line through a first via hole and electrically connected with the second signal line portion of the corresponding first signal line through a second via hole.

In some examples, the first via hole and the second via hole are located at a side of the voltage bus line away from the transparent region and disposed in parallel in the second direction.

In some examples, the second signal line portion of the first signal line further comprises a first extension portion and a second extension portion located at both sides of the bent portion and electrically connected with the bent portion; the first extension portion and the second extension portion are both extended along the first direction and are electrically connected with the first signal line sub-portion and the second signal line sub-portion, respectively.

In some examples, the voltage bus line is overlapped with the first extension portion and the second extension portion of the second signal line portion in a direction perpendicular to the base substrate, and is not overlapped with the bent portion in the direction perpendicular to the base substrate.

In some examples, the display substrate further comprises a plurality of third signal line sub-portions located in the first display region and extended along the first direction; the plurality of third signal line sub-portions are respectively connected with control terminals of reset sub-circuits of rows of sub-pixels, located in the first display region, in the plurality of first pixel rows in one-to-one correspondence to provide reset control signals.

In some examples, the display substrate further comprises a plurality of fourth signal line sub-portions in the peripheral region; the plurality of fourth signal line sub-portions are electrically connected with the plurality of third signal line sub-portions in one-to-one correspondence; each of the plurality of fourth signal line sub-portions is electrically connected with the bent portion of the second signal line portion of the first signal line connected with sub-pixels which are connected with a third signal line sub-portion corresponding to the each fourth signal line sub-portion.

In some examples, one end of each fourth signal line sub-portion is electrically connected with a corresponding third signal line sub-portion, and the other end of the each fourth signal line sub-portion is electrically connected with the bent portion; in a direction perpendicular to the base substrate, the voltage bus line is overlapped with each of the plurality of fourth signal line sub-portions.

In some examples, first signal line portions of the plurality of first signal lines and the first capacitor electrode are located in a same layer and insulated from each other, second signal line portions of the plurality of first signal lines and the second capacitor electrode are located in a same layer and insulated from each other.

In some examples, the display substrate further comprises a plurality of second signal lines extended along the second direction, and each of the plurality of second signal lines comprises a first signal line portion in the display region and a second signal line portion in the peripheral region; the second signal line portion of each of the plurality of second signal lines comprises a first signal line sub-portion, a second signal line sub-portion and a third signal line sub-portion which are connected in sequence, the first signal line sub-portion and the third signal line sub-portion of each of the plurality of second signal lines are in a linear structure, and the second signal line sub-portion of each of the plurality of second signal lines has a curved structure; the plurality of second signal lines are power supply lines.

In some examples, the display substrate further comprises a plurality of second connection electrodes; the plurality of second connection electrodes and the plurality of second signal lines are disposed in a same layer and insulated from each other, and the plurality of first voltage lines are respectively electrically connected with the voltage bus line through the plurality of second connection electrodes.

In some examples, the display substrate further comprises a dummy electrode, wherein the dummy electrode is at least partially around the transparent region and is closest to the transparent region compared with other conductive lines.

In some examples, the display substrate further comprises a plurality of first compensation electrodes located in the peripheral region, and the plurality of first compensation electrodes are respectively disposed in one-to-one correspondence with the plurality of first signal lines; the plurality of first compensation electrodes are located at a side of third signal line sub-portions of the plurality of first signal lines away from the base substrate; each of the plurality of first compensation electrodes overlaps with the bent portion of the second signal line portion of a corresponding first signal line in a direction perpendicular to the base substrate to form a compensation capacitor; the plurality of first compensation electrodes are located at a side of the voltage bus line close to the transparent region.

At least an embodiment of the present disclosure further provides a display device, comprising the display substrate provided by any one of the above embodiments.

In some examples, the display substrate further comprises a sensor, and the sensor is disposed at a side of the base substrate away from the plurality of sub-pixels and is configured to receive and detect light transmitted through the transparent region.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

In a display device integrated with an imaging element, the imaging element is disposed in a display region of the display device, which is conducive to increasing the proportion of the display screen, for example, to achieving full-screen display. Because display elements are formed in the display region, the display elements will affect the light transmittance of the imaging element. For example, light emitting elements and opaque wires in sub-pixels may prevent the imaging element from capturing light, thus affecting the imaging quality. For example, the light transmittance of a region of the display region where the imaging element is located can be improved by not arranging sub-pixels and signal lines in the region, but this arrangement will affect the connection and distribution of signal lines around the region, and also cause some pixel rows to miss pixels, that is, the number of sub-pixels in different rows is different, resulting in different loads of signal lines connecting the sub-pixels in the different rows, and then the signal transmission speeds of these signal lines are different, resulting in nonuniform display.

Figure 1A:
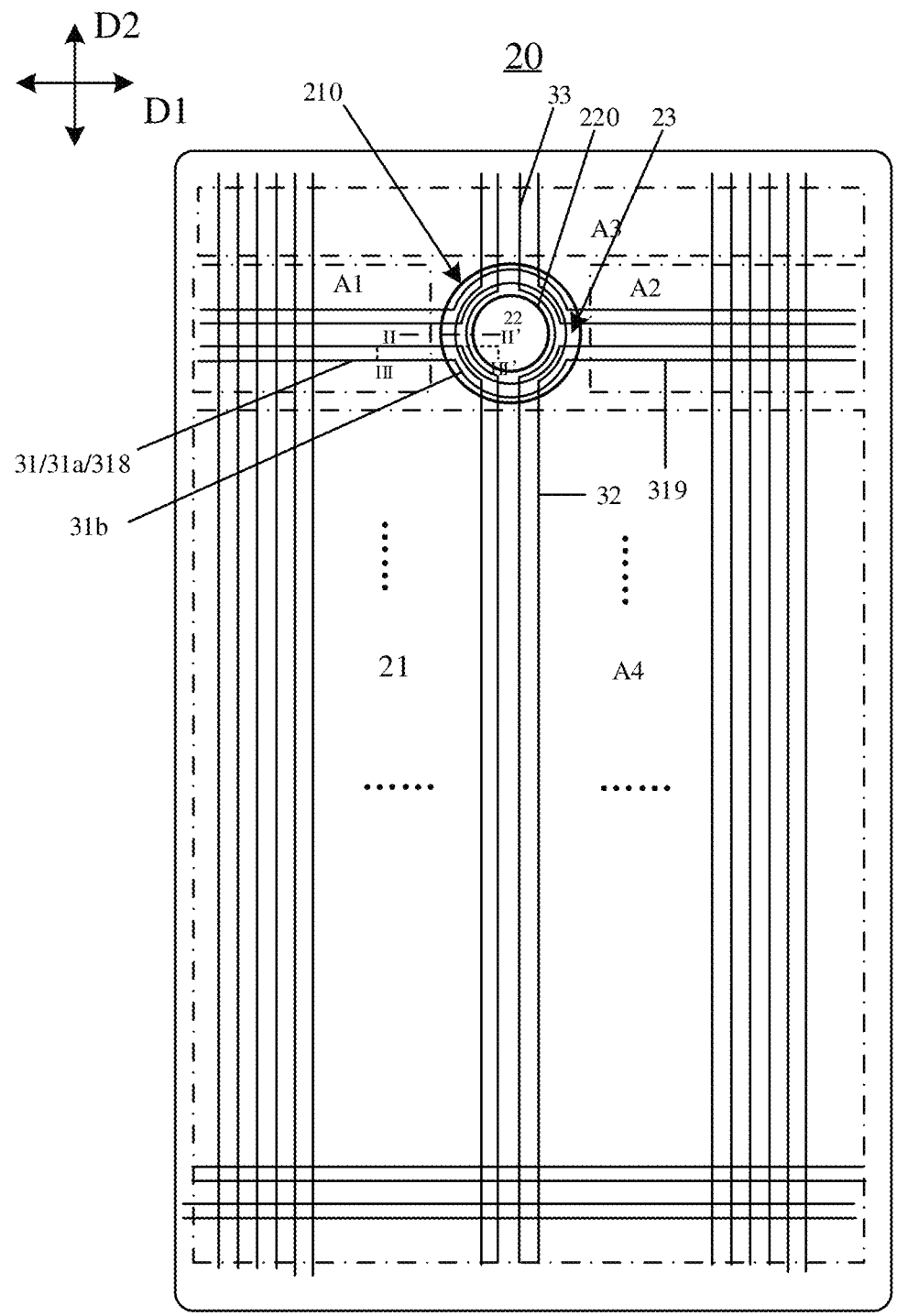
FIG. 1A is a first schematic diagram of a display substrate provided by at least one embodiment of the present disclosure.

FIG. 1A shows a schematic plan view of a display substrate provided by at least one embodiment of the present disclosure. As illustrated by FIG. 1A, the display substrate 20 includes a display region 21 and a transparent region 22. The display region 21 is a region where sub-pixels are disposed, and the transparent region 22 is provided with no sub-pixels. For example, no pixel circuits or even signal lines are disposed in the transparent region 22, so that the light transmittance is relatively high and approximately transparent. The display substrate further includes a peripheral region 23 located between the display region 21 and the transparent region 22, and the peripheral region 23 is, for example, an annular region disposed around the transparent region 22. While passing by the transparent region 22, the signal line is extended around the transparent region 22 to avoid shielding the transparent region. The peripheral region 23 is also provided with no pixel circuits, and provides a space around the transparent region 22 for wiring.

The display region 21 includes a first display region A1 and a second display region A2 which are separated by the transparent region 22 and are opposite to each other in a first direction D1. For example, the transparent region 22 is located in the display region 21, and the display region 21 further includes a third display region A3 and a fourth display region A4 which are separated by the transparent region 22 and are opposite to each other in a second direction D2. In other examples, the transparent region 22 may also be located outside the display region 21 in the second direction D2, that is, there is a recessed region in the display region 21, and the transparent region 22 is disposed in the recessed region. The relative positional relationship between the transparent region 22 and the display region 21 is not limited in the present disclosure.

The display substrate 20 includes a plurality of sub-pixels located in the display region 21, which are respectively a plurality of pixel rows and a plurality of pixel columns along the first direction D1 and the second direction D2. The first direction D1 and the second direction D2 are different, for example, orthogonal to each other. The plurality of pixel rows include a plurality of first pixel rows separated by the transparent region, and sub-pixels in the plurality of first pixel rows are separated by the transparent region 22 and located in the first display region A1 and the second display region A2, that is, the first display region A1 includes multiple rows of sub-pixels, and the second display region A2 also includes multiple rows of sub-pixels in the corresponding pixel rows. Due to the existence of the transparent region 22, the number of sub-pixels in the first pixel rows is less than that in a row of sub-pixels in the display region 21 except the first display region A1 and the second display region A2 (for example, in the third display region A3 and the fourth display region A4).

In FIG. 1A, sub-pixels are omitted, and only the distribution of some signal lines is schematically shown. As illustrated by FIG. 1A, in order to improve the light transmittance of the transparent region 22, the signal lines extend around the transparent region 22 when passing by the transparent region 22 to avoid shielding the transparent region 22. This wiring manner makes the signal lines in the peripheral region 23 around the transparent region 22 denser, which not only requires higher process technology, but also affects the product yield.

Figure 1B:
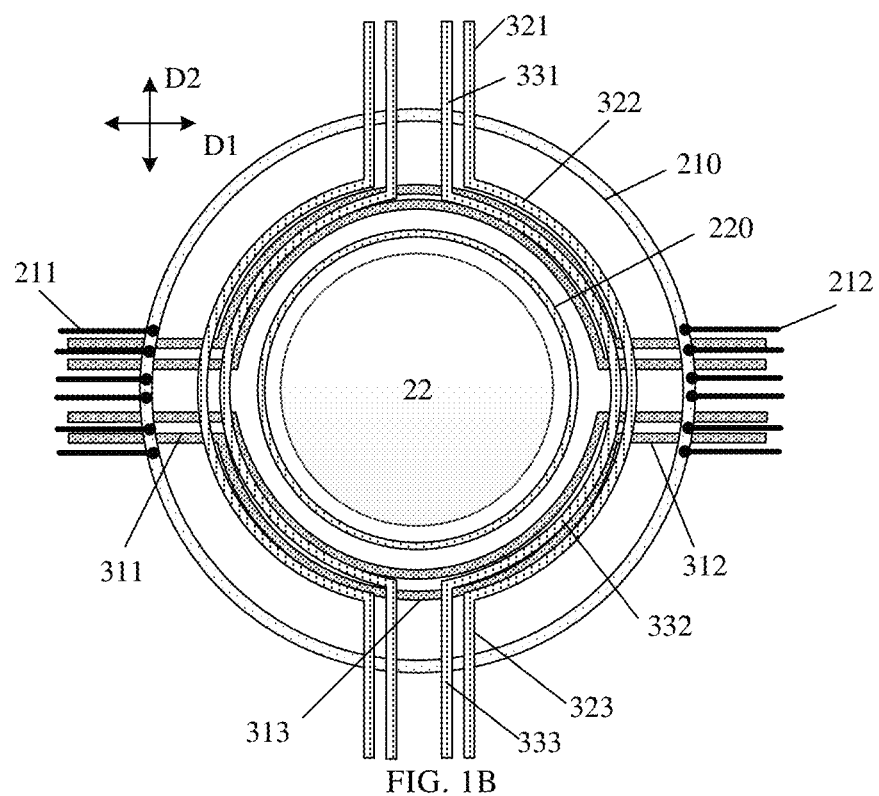
FIG. 1B is a second schematic diagram of a display substrate provided by at least one embodiment of the present disclosure.

FIG. 1B shows an example of an enlarged schematic diagram of the transparent region and the peripheral region. As illustrated by FIG. 1B, the display substrate 20 further includes a voltage bus line 210 located in the peripheral region 23 between the display region 21 and the transparent region 22. The voltage bus line 210 is disposed at least partially around the transparent region 22, and is configured to be connected with sub-pixels in the plurality of first pixel rows to provide a first voltage. For example, the first voltage may be a power supply voltage (VDD or VSS) or a reset voltage (VINT) or other fixed voltage signals. Accordingly, the voltage bus line 210 may be a power supply voltage bus line or a reset voltage bus line. Understandably, the sub-pixels in the plurality of first pixel rows receive the same first voltage because they are connected with the same voltage bus line 210, and because of the voltage drop on the signal lines, the values of the first voltage received by the sub-pixels at different positions may be different, which is not limited in the present disclosure.

The display substrate provided by the embodiment of the present disclosure provides voltages to the sub-pixels in the plurality of pixel rows (i.e., the plurality of first pixel rows) separated by the transparent region 22 by providing the voltage bus line 210, which connects the sub-pixels located in the same first pixel row but respectively in the first display region A1 and the second display region A2, so that the loads of the sub-pixels located in the same first pixel row are the same (because they are all connected with the voltage bus line 210), and the display uniformity is improved. In addition, the voltage bus line 210 is connected with the sub-pixels of the plurality of first pixel rows at the same time to provide voltage signals, thus simplifying the wiring of the peripheral region, optimizing the process and improving the product yield.

For example, as illustrated by FIG. 1B, the display substrate 10 further includes a plurality of first voltage lines 211 and a plurality of second voltage lines 212 extended along the first direction D1, the plurality of first voltage lines 211 and the plurality of second voltage lines 212 are all electrically connected with the voltage bus line 210. The plurality of first voltage lines 211 are located in the first display region A1, and are respectively connected with the multiple rows of sub-pixels located in the first display region A1 in the plurality of first pixel rows to provide the first voltage. The plurality of second voltage lines 212 are located in the second display region A2, and are respectively connected with the multiple rows of sub-pixels located in the second display region A2 in the plurality of first pixel rows to provide the first voltage.

Due to the existence of the voltage bus line 210, the first voltage lines 211 located in the first display region A1 and the second voltage lines 212 located in the second display region A2 do not need to be electrically connected through winding, but only need to be electrically connected with the voltage bus line at the corresponding side of the voltage bus line.

For example, as illustrated by FIGS. 1A-1B, the voltage bus line 210 is annular and completely surrounds the transparent region 22. In other examples, the voltage bus line 210 may partially surround the transparent region 22 or have other shapes, as long as the voltage bus line 210 can be electrically connected with the first voltage lines 211 and the second voltage lines 212 on both sides of the transparent region 22.

For example, as illustrated by FIGS. 1A-1B, the display substrate 20 further includes a plurality of first signal lines 31, and the plurality of first signal lines 31 are respectively connected with sub-pixels of the plurality of first pixel rows in one-to-one correspondence to provide first signals; the plurality of first signal lines 31 may be, for example, scanning lines or control lines, and the first signals may be, for example, scanning signals or control signals (such as reset control signals or light emission control signals).

Each of the plurality of first signal lines 31 includes a first signal line portion 31a located in the display region 21 and a second signal line portion 31b located in the peripheral region 23, the first signal line portion 31a and the second signal line portion 31b are electrically connected with each other.

As illustrated by FIG. 1A, the first signal line portion 31a includes a first signal line sub-portion 318 located in the first display region A1 and a second signal line sub-portion 319 located in the second display region A2. The second signal line portion 31b of each first signal line 31 is located between the first signal line sub-portion 318 and the second signal line sub-portion 319 of the each first signal line 31 and electrically connects the first signal line sub-portion 318 and the second signal line sub-portion 319.

As illustrated by FIG. 1B, both the first signal line sub-portion 318 and the second signal line sub-portion 319 are in a linear structure and extend along the first direction D1. The first signal line sub-portion 318 is connected with the sub-pixels located in the first display region A1 in the first pixel row corresponding to the first signal line 31 to which the first signal line sub-portion 318 belongs, and the second signal line sub-portion 319 is connected with the sub-pixels located in the second display region A2 in the corresponding first pixel row.

FIG. 1B shows only the second signal line portion 31b of the first signal line 31. As illustrated by FIG. 1B, the second signal line portion 31b includes a bent portion 313 extended along the transparent region 22. For example, the bent portion 313 is curved and extended around the transparent region 22. For example, as illustrated by FIG. 1B, the bent portion 313 is a part of an arc shape, but the present disclosure is not limited thereto. In other examples, the bent portion 313 may include a plurality of portions which are connected in sections and have different shapes.

As illustrated by FIGS. 1A and 1B, the bent portions 313 in the second signal line portions 31b of the plurality of first signal lines 31 are located at a side of the voltage bus line 210 close to the transparent region 22. This arrangement allows the voltage bus line 210 to avoid the winding area with dense wires, which is conducive to the electrical connection between the voltage bus line 210 and the first voltage lines 211 or the second voltage lines 212.

For example, as illustrated by FIG. 1B, the second signal line portion 31b further includes a first extension portion 311 and a second extension portion 312 located at both sides of the bent portion 313, and the first extension portion 311 and the second extension portion 312 are electrically connected to both ends of the bent portion 313, respectively. The first extension portion 311 extends to the first display region A1 along the first direction D1 and is electrically connected with the corresponding first signal line sub-portion 318, and the second extension portion 312 extends to the second display region A2 along the first direction D1 and is electrically connected with the corresponding second signal line sub-portion 319. For example, both the first extension portion 311 and the second extension portion 312 are in a linear structure.

For example, due to the existence of the transparent region 22, the number of sub-pixels in the first pixel rows is less than that in a row of sub-pixels in the display region 21 except the first display region A1 and the second display region A2 (e.g., in the third display region A3 and the fourth display region A4), and the load of signal lines (e.g., scanning lines) connected to the first pixel rows is smaller than that of a signal line connected to a complete pixel row in the third display region A3 or the fourth display region A4.

For example, a low compensation may be performed on the first signal line to narrow the load difference between the first signal line and other signal lines, for example, to make the load of the first signal line basically the same as the load of other signal lines. One load compensation method is to form a compensation capacitor on the signal line, so as to improve the resistance-capacitance load of the signal line. For example, the capacitance value of the compensation capacitor can be designed according to the number of missing sub-pixels in the first pixel row corresponding to the first signal line. For example, a winding portion, which is in the peripheral region and not directly connected to the sub-pixels, of the signal line can be selected to form the compensation capacitor. In the case shown in FIG. 1B, the whole bent portion of the first signal line is arc-shaped, so it is inconvenient to calculate the electrode area forming the capacitor, and therefore it is inconvenient to design the compensation capacitor.

A display substrate provided by at least one embodiment of the present disclosure includes a first signal line extended along the first direction; the first signal line includes a first signal line portion located in the display region and a second signal line portion located in the peripheral region, and the first signal line portion and the second signal line portion are electrically connected with each other; the second signal line portion of the first signal line includes a first sub-portion, a second sub-portion and a third sub-portion which are sequentially connected, the first sub-portion and the third sub-portion both include a curved structure, and the second sub-portion is in a linear structure; the display substrate further includes a first compensation electrode located in the peripheral region, and the first compensation electrode is at least partially overlapped with the second sub-portion of the second signal line portion of the first signal line in a direction perpendicular to the base substrate to form a compensation capacitor.

According to the display substrate provided by the embodiment of the present disclosure, the linear structure is designed at the winding part of the first signal line, thus facilitating the design of the capacitance value of the compensation capacitor.

Figure 1C:
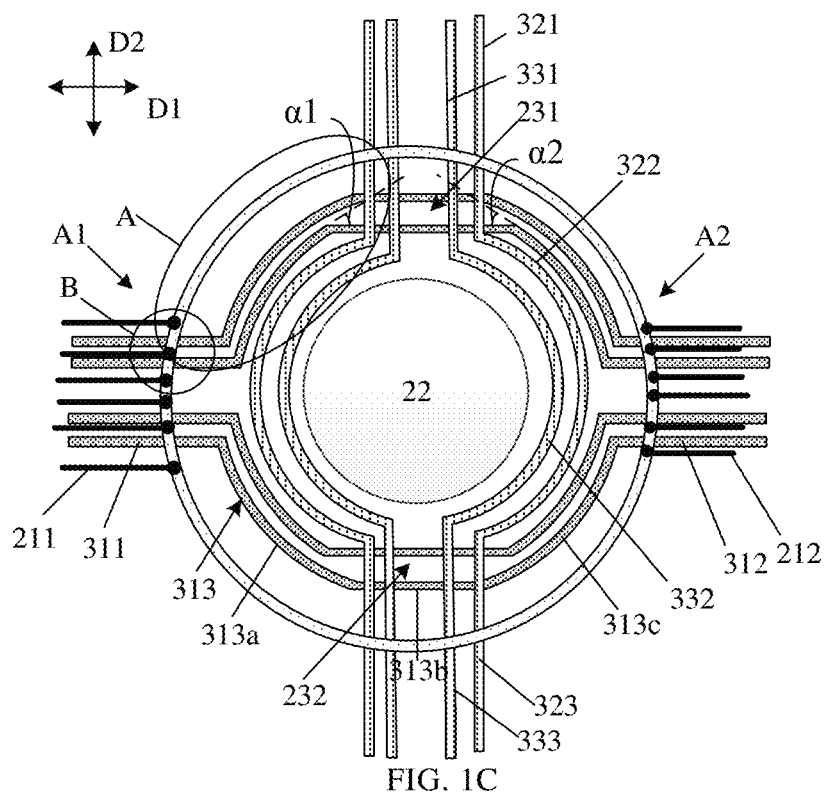
FIG. 1C is a third schematic diagram of a display substrate provided by at least one embodiment of the present disclosure.

FIG. 1C shows another example of an enlarged schematic diagram of the transparent region and the peripheral region of FIG. 1A. As illustrated by FIG. 1C, the display substrate 20 includes a first compensation region 231 located between the display region 21 and the transparent region 22, for example, the first compensation region 23 is a part of the peripheral region 23. For example, the bent portion 313 of the second signal line portion 31b of the first signal line 31 includes a first sub-portion 313a, a second sub-portion 313b and a third sub-portion 313c connected in sequence, that is, the second sub-portion 313b is located between the first sub-portion 313a and the third sub-portion 313c and electrically connected with the first sub-portion 313a and the third sub-portion 313c. The first sub-portion 313a is located at a side of the first compensation region 231 close to the first display region A1 and extends around the transparent region 22, and the third sub-portion 313c is located at a side of the first compensation region 231 close to the second display region A2 and extends around the transparent region 22. The first sub-portion 313a and the third sub-portion 313c both include curved structures, that is, at least part or all of the first sub-portion 313a and the third sub-portion 313c are curved structures. The second sub-portion 313b is in a linear structure. At least part of the second sub-portion 313b is located in the first compensation region 231 for coupling with the first compensation electrode to form the compensation capacitor. The extended direction of the second sub-portion 313b is parallel to the first direction D1, for example. As illustrated by FIG. 1C, the first sub-portion 313a and the third sub-portion 313c have arc-shaped structures, respectively.

For example, the first compensation electrode may be a part of a signal line overlapping with the second sub-portion 313b in the direction perpendicular to the substrate, or may be a specially provided compensation electrode, which is not limited by the embodiment of the present disclosure.

For example, as illustrated by FIG. 1B, the first sub-portion 313a and the third sub-portion 313c are respectively electrically connected with both ends of the second sub-portion 313b along the first direction D1, and an included angle α1 between a straight line that the second sub-portion 313b is located and a tangent line, at the connection point connecting the first sub-portion 313a and the second sub-portion 313b, of the first sub-portion 313a is acute. An included angle between the straight line that the second sub-portion 313b is located and a tangent line of the third sub-portion 313c, at the connection point connecting the second third sub-portion 313c and the second sub-portion 313b, of the first sub-portion 313a is acute.

Figure 2A:
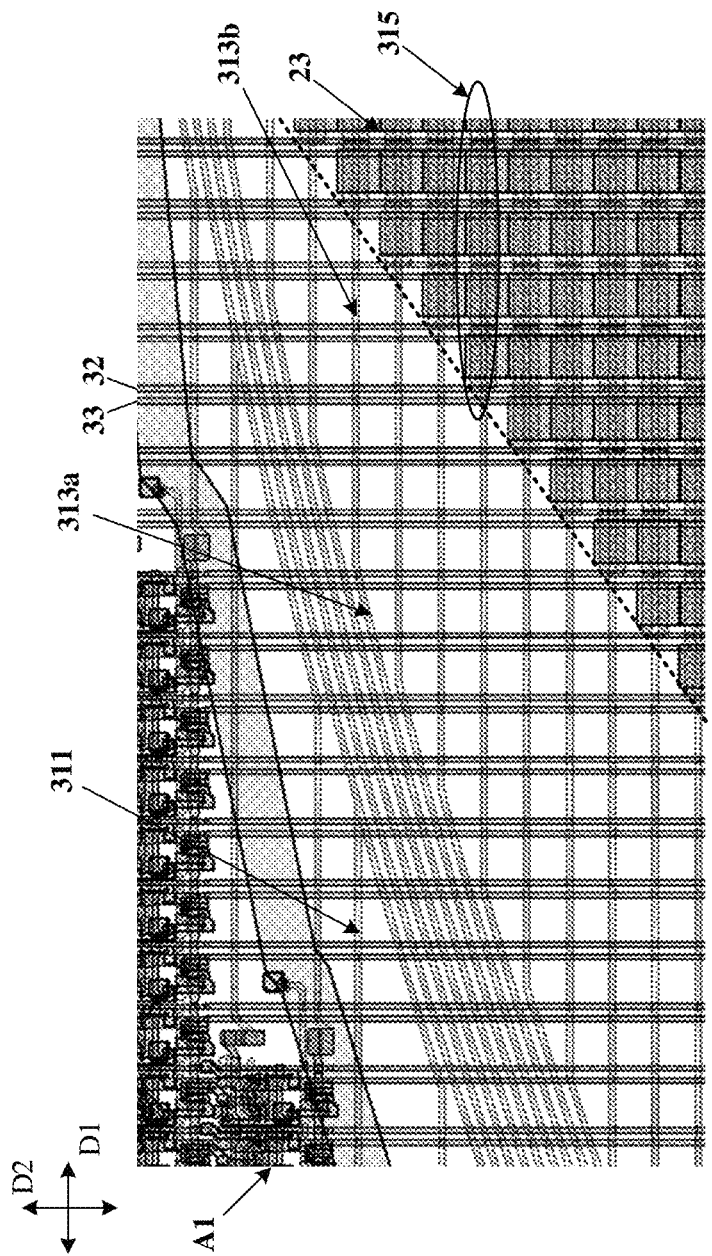
FIG. 2A is an enlarged schematic diagram of an area A in FIG. 1C.

FIG. 2A shows an enlarged schematic diagram of a region A in FIG. 1C, in which a partial outline of the first compensation region 231 is shown by dashed lines. As illustrated by FIG. 2A, the display substrate 20 includes a first compensation electrode 315 for forming the compensation capacitor, and the first compensation electrode 23 is located in the first compensation region 231. The first compensation electrode 315 overlaps with the second sub-portion of the second signal line portion of at least one first signal line 31 in the direction perpendicular to the base substrate to form a compensation capacitor.

For example, the display substrate 20 includes a plurality of first compensation electrodes 315, which are respectively disposed in one-to-one correspondence with the plurality of first signal lines 31, and each of the plurality of first compensation electrode 315 overlaps with a part of the second sub-portion 313b, which is located in the first compensation region 231, of the second signal line portion 31b of the corresponding first signal line 31 in a direction perpendicular to the substrate to form a compensation capacitor. For example, the first compensation electrode 315 is located at a side of the second signal line portion 31b away from the base substrate 200. For example, the capacitance value to be compensated on the first signal line 31 can be calculated according to the number of missing sub-pixels in the first pixel row corresponding to the first signal line 31, so as to determine a total area of the first compensation electrode 315.

Figure 2B:
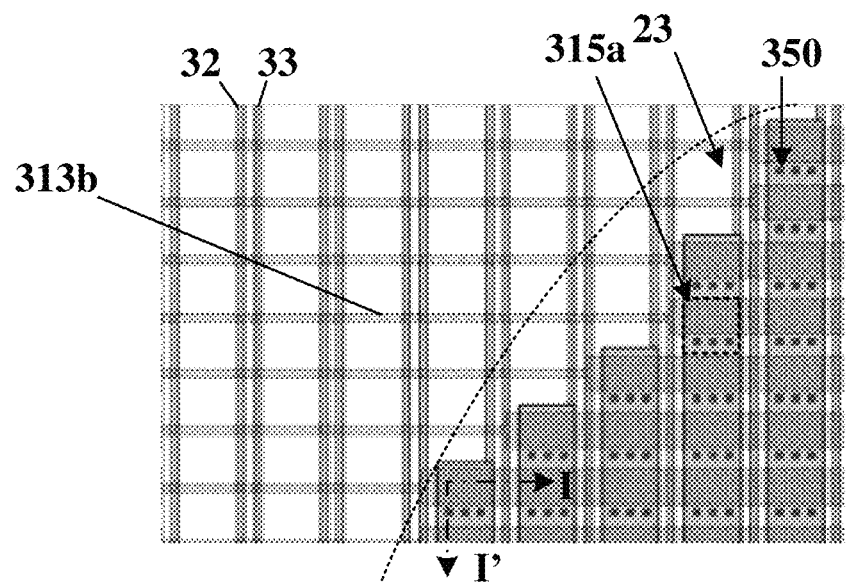
FIG. 2B is a partially enlarged schematic diagram of FIG. 2A.
Figure 2C:
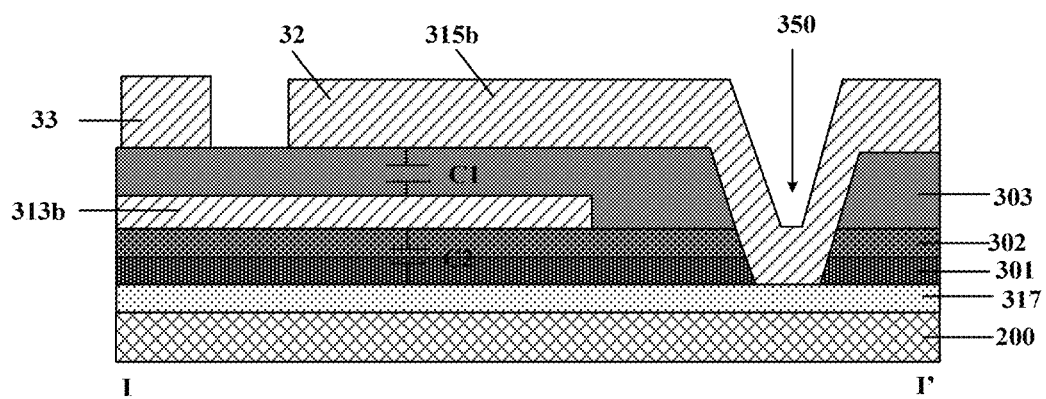
FIG. 2C is a sectional view of FIG. 2B along a section line I-I'.

FIG. 2B shows a partially enlarged schematic diagram of FIG. 2A, and FIG. 2C shows a sectional view of FIG. 2B along the section line I-I'. Due to the space limitation, for each of the plurality of first signal lines 31, only the case of the second sub-portion 313b of the second signal line portion 31b close to the first sub-portion 313a is shown in FIGS. 2B and 2C.

As illustrated by FIGS. 2A-2B, an average line width (average dimension along the second direction D2 in FIG. 2A) of the second sub-portion 313b of the second signal line portion 31b is larger than that of the first sub-portion 313a or the third sub-portion 313c. Because the second sub-portion 313b serves as a capacitor electrode of the compensation capacitor, increasing the line width of the second sub-portion 313b helps to increase the area of the compensation capacitor, thereby obtaining a larger compensation capacitor. For example, the second sub-portion 313b includes a first portion located in the first compensation region 231 for forming a compensation capacitor and a second portion located outside the first compensation region 231. The average line width of the first portion is larger than that of the second portion, and the average line width of the second portion can be consistent with that of the first sub-portion 313a. That is, the first compensation electrode 315 only partially overlaps with the second sub-portion 313b to form the compensation capacitor, and the overlapping area of the second sub-portion and the first compensation electrode can be determined according to the calculated capacitance value to be compensated.

For example, each first compensation electrode 315 is divided into a plurality of compensation electrode portions 315a spaced apart from each other; because for each first signal line 31, the corresponding first compensation electrode 315 may not be continuously disposed, for example, spaced apart by other signal lines. On the other hand, dividing each first compensation electrode 315 into a plurality of compensation electrode portions 315a is beneficial to the compensation design.

For example, as illustrated by FIGS. 2B-2C, the area of each compensation electrode portion 315a may be the same or substantially the same, and each compensation electrode portion 315a and a part of the second sub-portion 313b overlapping with the compensation electrode portion 315a constitute a compensation sub-capacitor, that is, each compensation capacitor includes a plurality of compensation sub-capacitors connected in parallel connection with each other. According to the number of missing sub-pixels in the first pixel row corresponding to the first signal line 31, the capacitance value to be compensated on the first signal line 31 and the capacitance value of each compensation sub-capacitance can be calculated, and the number of compensation electrode portions 315 to be correspondingly disposed on the first signal line 31 can be determined and set accordingly.

For example, a fixed voltage can be applied to the first compensation electrode 315, which is beneficial to improving the stability of the compensation capacitor.

For example, the plurality of compensation electrode portions in the plurality of first compensation electrodes are disposed in an array along the first direction D1 and the second direction D2, for example, as illustrated by FIG. 2B, the compensation electrode portions in the same column can be connected to each other into an integrated structure, which can reduce the processing difficulty.

In the first direction D1, multiple compensation electrode portions 315a corresponding to each second sub-portion 313b are electrically connected with each other, thereby ensuring that the compensation sub-capacitors formed on the second sub-portion 313b can be connected in parallel with each other. Because the plurality of compensation electrode portions 315a are spaced apart from each other and not directly electrically connected with each other, and electrical connection can be formed by other structures.

For example, as illustrated by FIG. 2C, the display substrate 20 further includes a second compensation electrode 317. In the direction perpendicular to the base substrate, the second compensation electrode 317 and the first compensation electrode 315 are located on both sides of the second signal line portion 31b of the first signal line 31 and are electrically connected with each other, thereby forming a parallel capacitor structure which helps to increase the capacitance value of the compensation capacitor in a limited space. For example, the second compensation electrode 317 is located at a side of the second signal line portion 31b close to the base substrate, and the first compensation electrode 315 is located at a side of the second signal line portion 31b away from the base substrate.

For example, the second compensation electrodes 317 include a semiconductor material, which is a conductive semiconductor material, such as a heavily doped semiconductor material. For example, the second compensation electrode 317 is disposed in the same layer as the active layer of a transistor in the pixel circuit and integrally formed.

For example, as illustrated by FIG. 2C, the first compensation electrode 315 and the second sub-portion 313b constitute a first capacitor C1, and the second sub-portion 313b and the second compensation electrode 317 constitute a second capacitor C2, and each compensation electrode portion 315a is electrically connected with the second compensation electrode 317 through a via hole 350.

For example, the display substrate 20 includes a plurality of second compensation electrodes 317, which are disposed in one-to-one correspondence with the second sub-portions 313b of the second signal line portions 31b of the plurality of first signal lines 31, that is, plurality of second compensation electrodes 317 are disposed in one-to-one correspondence with the plurality of first compensation electrodes 315.

For example, the plurality of second compensation electrodes 317 are in an integrated structure; thus, the plurality of compensation electrode portions 315a electrically connected with the second compensation electrodes 317 are electrically connected with each other, so that the plurality of compensation sub-capacitors formed on each second sub-portion 313b can be connected in parallel connection with each other.

For example, in the case where the transparent region 22 is a circular region, the numbers of missing sub-pixels in the plurality of first pixel rows separated by the transparent region 22 are different. For example, the first pixel row arranged corresponding to the diameter of the circular region has the most missing sub-pixels.

Figure 3:
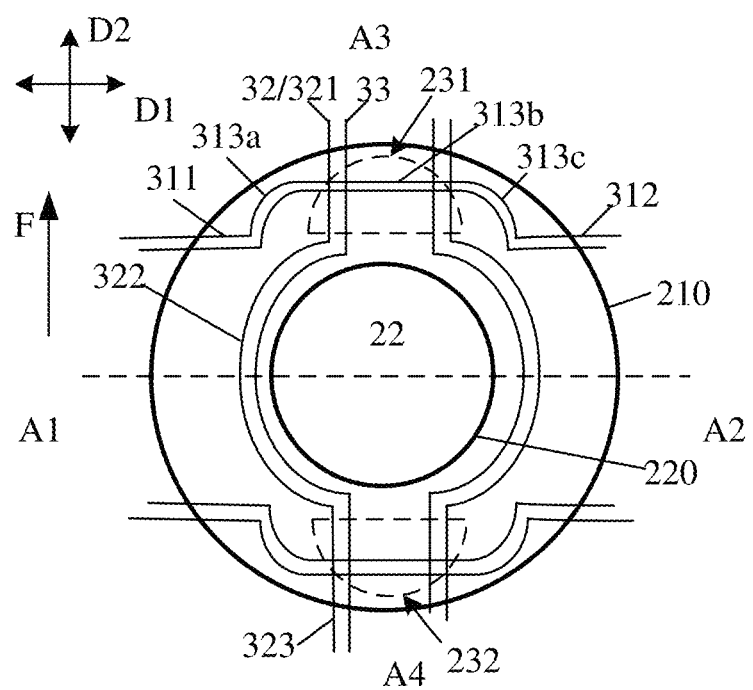
FIG. 3 is a fourth schematic diagram of a display substrate provided by at least one embodiment of the present disclosure.

FIG. 3 shows a schematic layout diagram of a region of the display substrate around the transparent region 22. For convenience of explanation, the signal lines in the figure are only schematically shown, and the blank region around the figure represent the display region 21. With reference to FIG. 1B, the display substrate 20 further includes a second compensation region 232 located between the display region 21 and the transparent region 22. The first compensation region 231 and the second compensation region 232 are located at opposite sides of the transparent region 22 in the second direction D2, for example, symmetrically disposed with respect to the geometric center of the transparent region 22.

The arrangement of the compensation electrodes in the second compensation region is similar to that in the first compensation region, which is not repeated here.

As illustrated by FIG. 3, both the first compensation region and the second compensation region are located at a side of the voltage bus line 210 close to the transparent region 22, that is, the plurality of first compensation electrodes are located at a side of the voltage bus line 210 close to the transparent region 22.

For example, the plurality of first pixel rows separated by the transparent region 22 are divided into a first part and a second part with basically the same number of rows in the second direction D2 (for example, divided along the dashed line in FIG. 3), such as the upper half part and the lower half part separated by the dashed line in FIG. 3. The first signal lines correspondingly connected to the first part are compensated by the compensation region on the same side, such as the first compensation region 231 located on the upper side in FIG. 3; the first signal lines correspondingly connected to the second part are compensated by the compensation region on the same side, such as the second compensation region 232 located on the lower side in FIG. 3. By setting the first compensation region and the second compensation region in the upper and lower regions respectively, wiring gathering can be avoided, thus optimizing the wiring and the layout of substrate.

For example, for the multiple first pixel rows to be compensated by the first compensation region 231, the number of missing sub-pixels in the second direction D2 varies monotonously, so the area of the first compensation electrode 315 corresponding to each first pixel row varies monotonously, for example, the number of compensation electrode portions 315a corresponding to each first pixel row varies monotonously. For example, in the direction F shown in FIG. 3, the number of missing sub-pixels of the multiple first pixel rows to be compensated by the first compensation region 231 varies monotonously and decreases monotonously, the area of the first compensation electrodes 315 corresponding to each first pixel row decreases monotonously, and the number of compensation electrode portions 315a corresponding to each first pixel row decreases monotonously, thus forming a semicircular first compensation region 231 as illustrated by FIG. 3. Similarly, the second compensation region 232 is also a semicircular region, which is not repeated here.

For example, in each compensation region, the plurality of compensation electrode portions 315a corresponding to the multiple first signal lines 31 are disposed in an array along the first direction D1 and the second direction D2, and the number of compensation electrode portions 315a in each row in the first direction D1 varies monotonously in the second direction D2.

Referring to FIGS. 1A-1C, 2A-2B and FIG. 3, the display substrate 20 further includes a plurality of second signal lines 32 extended along the second direction D2, and each of the plurality of second signal lines 32 includes a first signal line portion located in the display region and a second signal line portion located in the peripheral region. For example, the first signal line portion and the second signal line portion are disposed in the same layer and connected into an integrated structure.

Only the second signal line portion of the second signal line 32 is shown in FIGS. 1B-1C and FIG. 3. As illustrated by FIGS. 1B-1C and FIG. 3, the second signal line portion includes a first signal line sub-portion 321, a second signal line sub-portion 322 and a third signal line sub-portion 323 which are connected in sequence. the first signal line sub-portion 321 and the third signal line sub-portion 323 are in a linear structure, and the second signal line sub-portion 322 has a curved structure. For example, the second signal line sub-portion 322 is a curved structure extended along the transparent region 22. The first signal line sub-portion 321 and the second signal line sub-portion 323 of the second signal line 32 located in the compensation region are designed as straight structures to facilitate the design of compensation capacitors.

For example, a plurality of first signal line sub-portions 321 of the plurality of second signal lines 32 are disposed in one-to-one correspondence with a plurality of columns of compensation electrode portions 315a. For example, the compensation electrode portions 315a of each column are electrically connected with the first signal line sub-portions 321 of a corresponding second signal line 32. For example, the plurality of second signal lines 32 are disposed in the same layer as the first compensation electrodes 315, and each of the plurality of second signal lines 32 is integrated with the corresponding column of compensation electrode portions 315a.

For example, the plurality of second signal lines 32 are power supply lines and are configured to be connected to the same power supply voltage terminal. Therefore, the plurality of compensation electrode portions 315a are electrically connected by being electrically connected with the respective corresponding second signal line 32, thereby connecting the plurality of compensation sub-capacitors in one row in parallel. In addition, by being electrically connected to the second signal line 32, a fixed voltage is applied to the first compensation electrode, thereby improving the stability of the compensation capacitors.

For example, as illustrated by FIG. 1A, the first signal line portion of the second signal line 32 is separated by the transparent region into two parts respectively located in the third display region A3 and the fourth display region A4, and the two parts of the same second signal line 32 are connected with sub-pixels located in the same column but separated by the transparent region to provide a power supply voltage.

Referring to FIGS. 1A-1C, 2A-2B, and 3, for example, the display substrate 20 further includes a plurality of third signal lines 33 extended along the second direction D2, and the third signal line 33 include a first signal line portion located in the display region and a second signal line portion located in the peripheral region. The second signal line portion of the third signal line 33 includes a first signal line sub-portion 331, a second signal line sub-portion 332 and a third signal line sub-portion 333 which are sequentially connected. As illustrated by FIG. 3, both the first signal line sub-portion 331 and the second signal line sub-portion 332 are in linear structures, and the second signal line portion 333 extends around the transparent region 22.

For example, the first signal line sub-portion 331, the second signal line sub-portion 332 and the second signal line portion 333 of each third signal line 33 are disposed in the same layer and integrally formed.

As illustrated by FIG. 3, the first signal line sub-portion 331 and the second signal line sub-portion 332 of the third signal line are respectively connected with the sub-pixels located in the same column (i.e. the first pixel column) in the third display region A3 and the fourth display region A4 to provide electrical signals. For example, the plurality of third signal lines are respectively connected with sub-pixels in a plurality of first pixel columns in one-to-one correspondence, and the first signal line portion of each third signal line 33 is electrically connected with the sub-pixels of the corresponding first pixel column. For example, the third signal line 33 is a data line.

For example, the plurality of second signal lines 32, the plurality of third signal lines 33 and the first compensation electrode 315 are all disposed in the same layer. Because the third signal line 33 needs to be insulated from the first compensation electrode 315, it is advantageous for wiring by separating the first compensation electrode 315 into a plurality of spaced compensation electrode portions 315b in the first direction D1.

Figure 4:
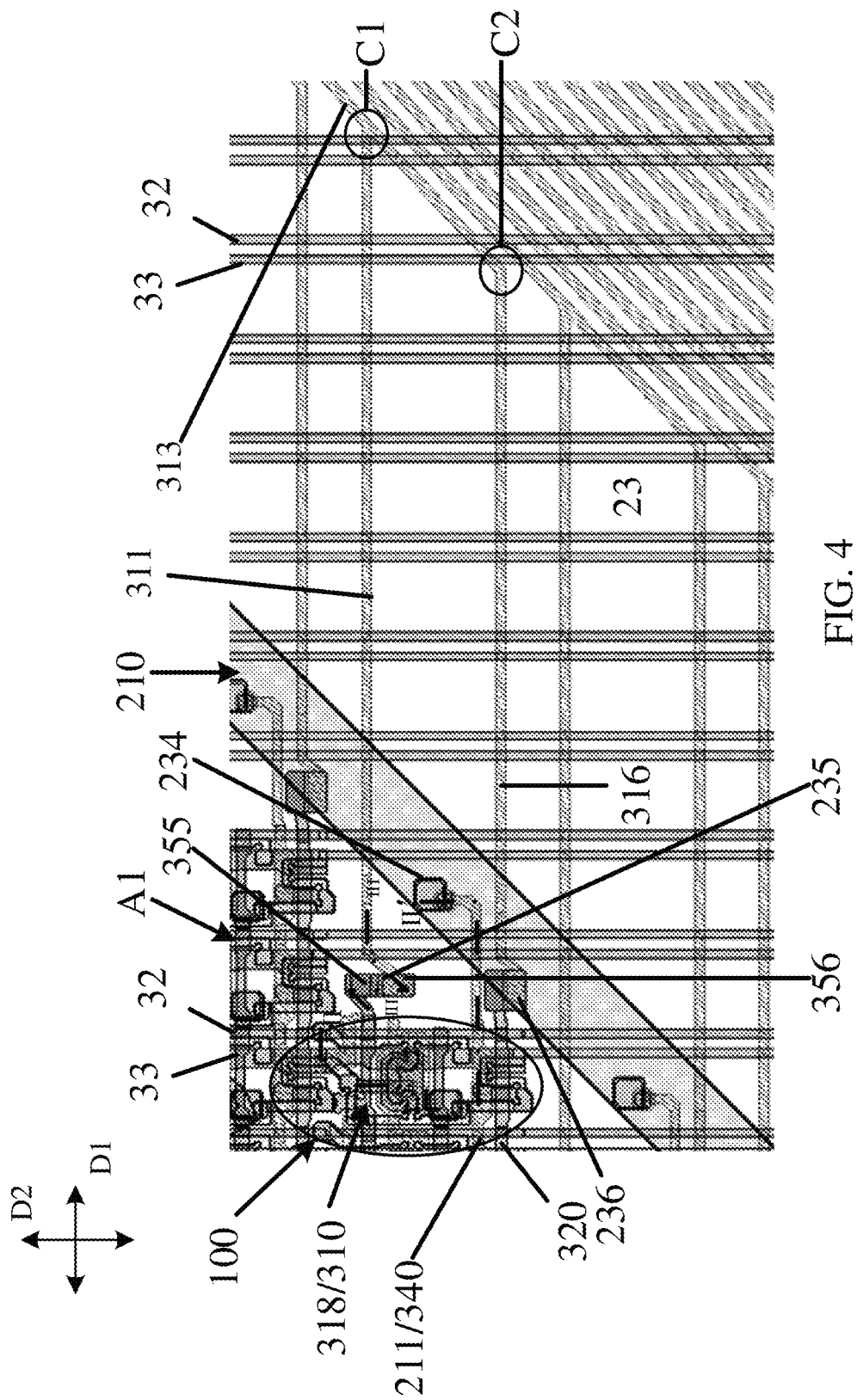
FIG. 4 is an enlarged schematic diagram of an area B in FIG. 1C.

FIG. 4 shows an enlarged schematic view of the area B in FIG. 1C. For example, each of the plurality of sub-pixels includes a light emitting element and a pixel circuit that drives the light emitting element to emit light. For example, the pixel circuit may include a driving sub-circuit, a data writing sub-circuit, a compensation sub-circuit and a storage sub-circuit, and may also include a light emitting control sub-circuit and a reset circuit as required. FIG. 4 shows a pixel circuit 100 in the first display region A1.

Figure 5A:
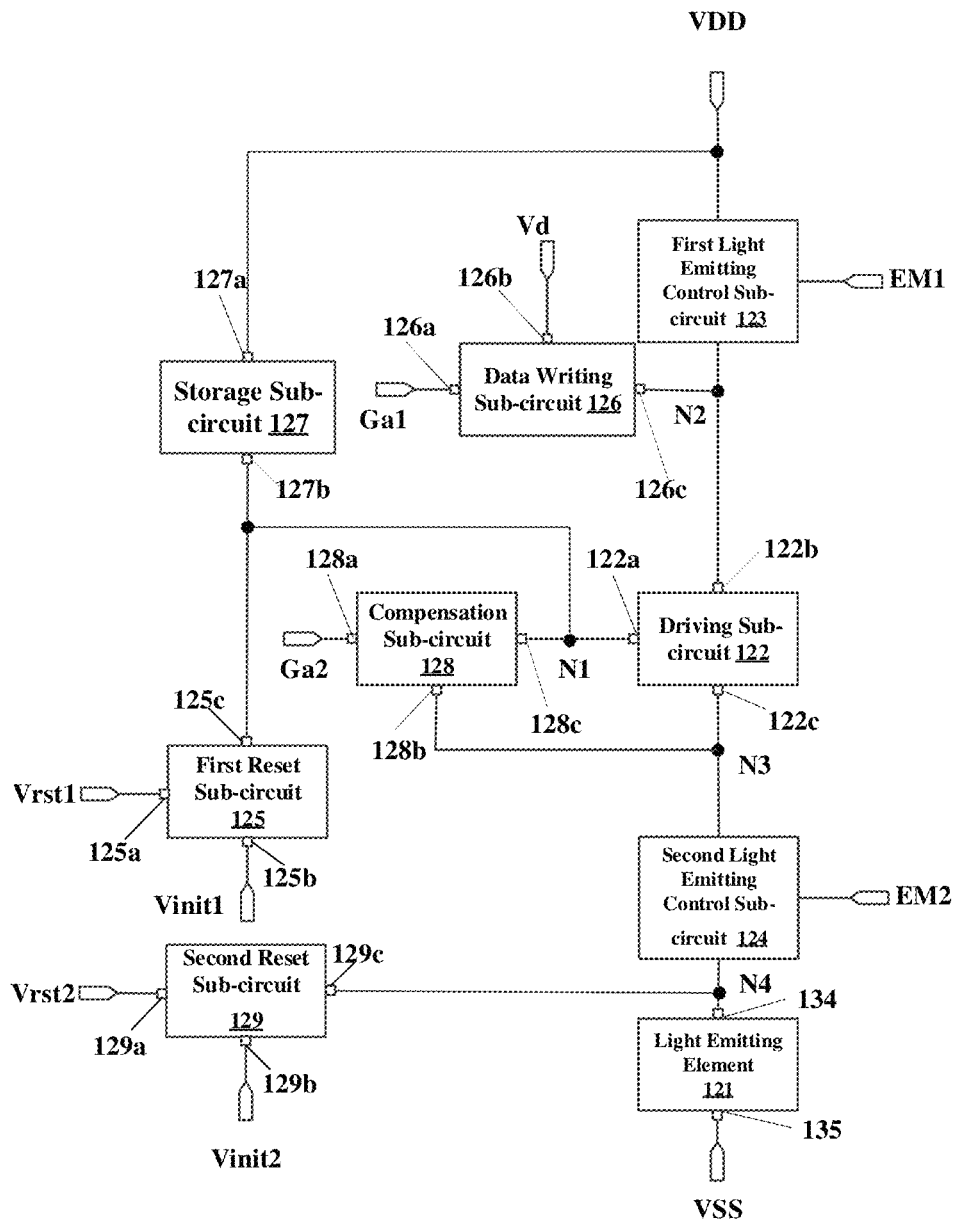
FIG. 5A is a schematic diagram of a pixel circuit provided by at least one embodiment of the present disclosure.

FIG. 5A shows a schematic circuit diagram of a pixel circuit provided by at least one embodiment of the present disclosure. As illustrated by FIG. 5A, the pixel circuit includes a driving sub-circuit 122, a compensation sub-circuit 128, a data writing sub-circuit 126, a storage sub-circuit 127, a first light emitting control sub-circuit 123, a second light emitting control sub-circuit 124, a first reset sub-circuit 125 and a second reset sub-circuit 129.

For example, the driving sub-circuit 122 includes a control terminal 122a, a first terminal 122b and a second terminal 122c, and is configured to be connected with the light emitting element 121 and control the driving current flowing through the light emitting element 121. A control terminal 122a of the driving sub-circuit 122 is connected to a first node N1, the first terminal 122b of the driving sub-circuit 122 is connected to a second node N2 and configured to receive a first power supply voltage VDD, and the second terminal 122c of the driving sub-circuit 122 is connected to a third node N3.

For example, the data writing sub-circuit 126 includes a control terminal 126a, a first terminal 126b and a second terminal 126c, the control terminal 126a is configured to receive a first scanning signal Ga1, the first terminal 126b is configured to receive a data signal Vd, and the second terminal 126c is connected to the first terminal 122b (i.e., the second node N2) of the driving sub-circuit 122. The data writing sub-circuit 126 is configured to write the data signal Vd to the first terminal 122b of the driving sub-circuit 122 in response to the first scanning signal Ga1. For example, in a data writing and compensation stage, the data writing sub-circuit 126 can be turned on in response to the first scanning signal Ga1, so that the data signal can be written to the first terminal 122b (second node N2) of the driving sub-circuit 122 and stored in the storage sub-circuit 127, so that the driving current for driving the light emitting element 121 to emit light can be generated according to the data signal in the light emitting stage, for example.

For example, the compensation sub-circuit 128 includes a control terminal 128a, a first terminal 128b and a second terminal 128c. The control terminal 128a of the compensation sub-circuit 128 is configured to receive a second scanning signal Ga2, and the first terminal 128b and the second terminals 128c of the compensation sub-circuit 128 are electrically connected with the second terminal 122c and control terminal 122a of the driving sub-circuit 122, respectively. The compensation sub-circuit 128 is configured to perform a threshold compensation to the driving sub-circuit 122 in response to the second scanning signal Ga2.

For example, the first scanning signal Ga1 may be the same as the second scanning signal Ga2. For example, the first scanning signal Ga1 may be connected to the same signal output terminal as the second scanning signal Ga2. For example, the first scanning signal Ga1 and the second scanning signal Ga2 may be transmitted through the same scan line.

In other examples, the first scanning signal Ga1 may also be different from the second scanning signal Ga2. For example, the first scanning signal Ga1 and the second scanning signal Ga2 may be connected to different signal output terminals. For example, the first scanning signal Ga1 and the second scanning signal Ga2 may be transmitted through different scanning lines, respectively.

The storage sub-circuit 127 includes a first terminal 127a and a second terminal 127b, the first terminal 127a of the storage sub-circuit 127 is configured to receive a first power supply voltage VDD and the second terminal 127b of the storage sub-circuit 127 is electrically connected to the control terminal 122a of the driving sub-circuit. For example, in a data writing and compensation stage, the compensation sub-circuit 128 can be turned on in response to the second scanning signal Ga2, so that the data signal written by the data writing sub-circuit 126 can be stored in the storage sub-circuit 127. At the same time, the compensation sub-circuit 128 can electrically connect the control terminal 122a and the second terminal 122c of the driving sub-circuit 122, so that the related information of the threshold voltage of the driving sub-circuit 122 can be correspondingly stored in the storage sub-circuit, so that, for example, the stored data signal and the threshold voltage can be used to control the driving sub-circuit 122 in a light emitting stage, so that the output of the driving sub-circuit 122 can be compensated.

For example, the storage sub-circuit 127 is electrically connected to the control terminal 122a of the driving sub-circuit 122 and the first power supply voltage terminal VDD, and is configured to store the data signal written by the data writing sub-circuit 126. For the pixel circuit of the first pixel circuit 110 located in the first display region 21, the first power voltage terminal VDD is the first power voltage terminal 103. For the pixel circuit of the second pixel circuit 120 located in the second display region 22, the first power supply voltage terminal VDD is the second power supply voltage terminal 104. For example, in the data writing and compensation stage, the compensation sub-circuit 128 can be turned on in response to the second scanning signal Ga2, so that the data signal written by the data writing sub-circuit 126 can be stored in the storage sub-circuit 127. At the same time, for example, in the data writing and compensation stage, the compensation sub-circuit 128 can electrically connect the control terminal 122a and the second terminal 122c of the driving sub-circuit 122, so that the related information of the threshold voltage of the driving sub-circuit 122 can be correspondingly stored in the storage sub-circuit, so that the stored data signal and threshold voltage can be used to control the driving sub-circuit 122 in the light emitting stage, for example, so that the output of the driving sub-circuit 122 can be compensated.

The first light emitting control sub-circuit 123 is connected to a first terminal 122b (second node N2) of the driving sub-circuit 122 and the first voltage terminal VDD, for example, and is configured to apply a first power supply voltage of the first voltage terminal VDD to the first terminal 122b of the driving sub-circuit 122 in response to a first light emitting control signal EM1. For example, as illustrated by FIG. 1B, the first light emitting control sub-circuit 123 is connected with the first light emitting control terminal EM1, the first voltage terminal VDD and the second node N2.

For example, the second light emitting control sub-circuit 124 is connected with a second light emitting control terminal EM2, a first terminal 134 of the light emitting element 121, and the second terminal 122c of the driving sub-circuit 122, and is configured such that a driving current can be applied to the light emitting element 122 in response to the second light emitting control signal.

For example, in the light emitting stage, the second light emitting control sub-circuit 123 is turned on in response to the second light emitting control signal EM2 provided by the second light emitting control terminal EM2, so that the driving sub-circuit 122 can be electrically connected with the light emitting element 121 through the second light emitting control sub-circuit 123, thereby driving the light emitting element 121 to emit light under the control of the driving current. In a non-light emitting stage, the second light emitting control sub-circuit 123 is turned off in response to the second light emitting control signal EM2, thereby preventing current from flowing through the light emitting element 121 to emit light, and improving the contrast of the corresponding display device.

For another example, in an initialization stage, the second light emitting control sub-circuit 124 may also be turned on in response to the second light emitting control signal EM2, so that the reset circuit may be combined to reset the driving sub-circuit 122 and the light emitting element 121.

For example, the second light emitting control signal EM2 may be the same as the first light emitting control signal EM1. For example, the second light emitting control signal EM2 may be connected to the same signal output end as the first light emitting control signal EM1, and may be transmitted through the same light emitting control line as the first light emitting control signal EM1.

In other examples, the second light emitting control signal EM2 may be different from the first light emitting control signal EM1. For example, the second light emitting control signal EM2 and the first light emitting control signal EM1 may be connected to different signal output terminals, respectively. For example, the second light emitting control signal EM2 and the first light emitting control signal EM1 may be transmitted through different light emitting control lines, respectively.

For example, the first reset sub-circuit 125 includes a first terminal 125a, a second terminal 125b and a third terminal 125c, the first terminal 125a is configured to receive a first reset control signal Rst1, the second terminal 125b is connected to a first reset voltage terminal Vinit1, and the third terminal 125c is connected to the control terminal 122a (first node N1) of the driving sub-circuit 122, the first reset sub-circuit 125 is configured to apply a first rest voltage Vinit1 to the control terminal 122a of the driving sub-circuit 122 in response to the first reset control signal Rst1.

For example, the second reset sub-circuit 129 (an example of the reset sub-circuit of the present disclosure) includes a first terminal 129a, a second terminal 129b and a third terminal 129c, the first terminal 129a is configured to receive a second reset control signal Rst2 (an example of the reset control signal of the present disclosure), the second terminal 129b is connected to a second reset voltage terminal Vinit2, and the third terminal 129c is connected to the first terminal 122b (the fourth node N4) of the light emitting element 122, the second reset sub-circuit 129 is configured to apply a second reset voltage Vinit2 to the first terminal 134 of the light emitting element 121 in response to the second reset control signal Rst2.

For example, the first reset sub-circuit 125 and the second reset sub-circuit 129 can be respectively turned on in response to the first reset control signal Rst1 and the second reset control signal Rst2, so that the second reset voltage Vinit2 can be applied to the first node N1 and the first reset voltage Vinit1 can be applied to the first terminal 134 of the light emitting element 121, respectively. In this way, the driving sub-circuit 122, the compensation sub-circuit 128 and the light emitting element 121 can be reset to eliminate the influence of the previous light emitting stage.

For example, the second reset control signal Rst2 of each row of sub-pixels may be the same signal as the first scanning signal Ga1 of the row of sub-pixels. For example, the first reset control signal Rst1 of each row of sub-pixels may be the same as the first scanning signal Ga1 or the second reset control signal Rst2 of the previous row of sub-pixels.

For example, the light emitting element 121 includes a first terminal 134 and a second terminal 135, the first terminal 134 of the light emitting element 121 is configured to be connected to the second terminal 122c of the driving sub-circuit 122, and the second terminal 135 is configured to be connected to a second voltage terminal VSS. For example, in one example, as illustrated by FIG. 2A, the first terminal 134 of the light emitting element 121 may be connected to the fourth node N4 through the second light emitting control sub-circuit 124. Embodiments of the present disclosure include but are not limited thereto.

It should be noted that, in the description of the embodiment of the present disclosure, the first node N1, the second node N2, the third node N3 and the fourth node N4 do not need to represent the actual components, but represent the convergence points of related circuit connections in the circuit diagram.

It should be noted that, in the description of the embodiment of the present disclosure, the symbol Vd can represent both the data signal terminal and the level of the data signal. Similarly, the symbols Ga1 and Ga2 can represent the first scanning signal and second scanning signal, and also represent the first scanning signal terminal and second scanning signal terminal. The symbol Rst can represent both the reset control terminal and the reset control signal; The symbols Vinit1 and Vinit2 can represent the first reset voltage terminal and the second reset voltage terminal, and the first reset voltage and the second reset voltage. The symbol VDD can represent both the first power supply voltage and the first power supply voltage terminal, and the symbol VSS can represent both the second power supply voltage terminal and the second power supply voltage. The following embodiments are the same and the repeated portions will be omitted herein.

Figure 5B:
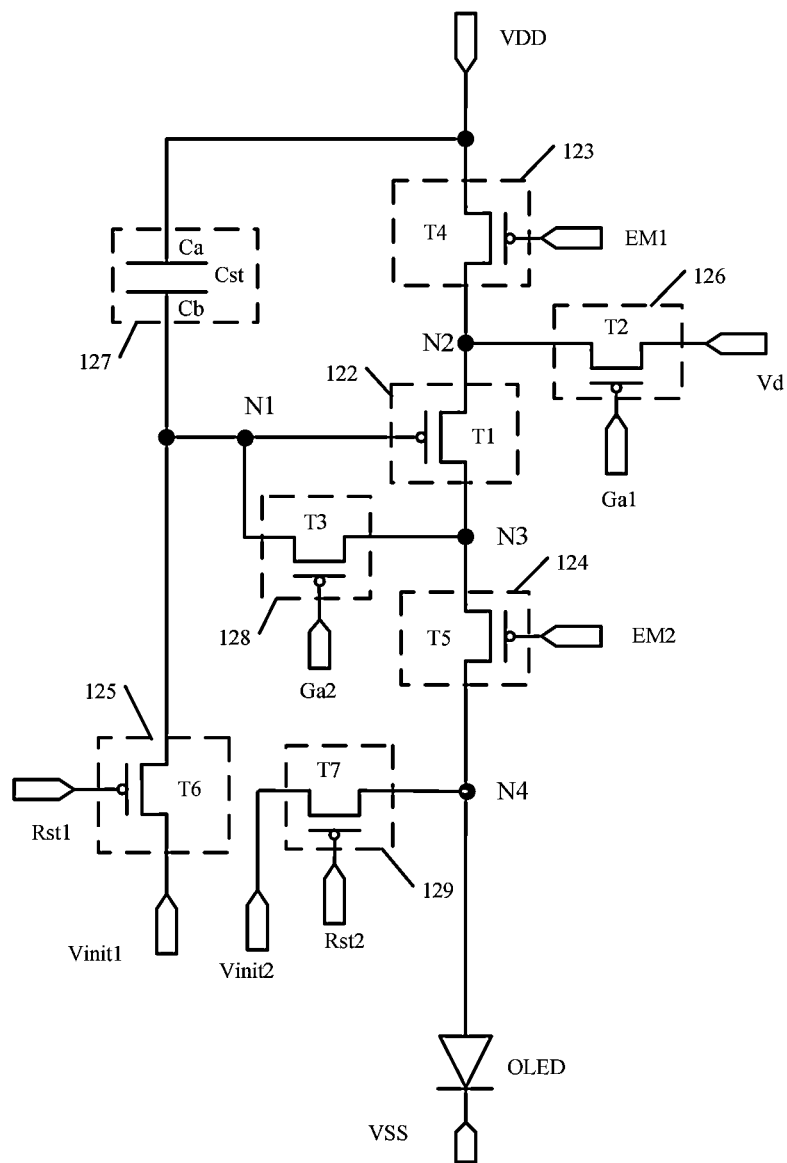
FIG. 5B is a circuit diagram of an implementation example of the pixel circuit shown in FIG. 5A.

FIG. 5B is a circuit diagram of an implementation example of the pixel circuit shown in FIG. 5A. As illustrated by FIG. 5B, the pixel circuit includes first to seventh transistors T1, T2, T3, T4, T5, T6, T7 and a storage capacitor Cst. For example, the first transistor T1 is used as a driving transistor, and other second to seventh transistors are used as switching transistors.

For example, as illustrated by FIG. 5B, the driving sub-circuit 122 may be implemented as the first transistor T1. A gate electrode of the first transistor T1 serves as the control terminal 122a of the driving sub-circuit 122 and is connected to the first node N1. A first electrode of the first transistor T1 serves as the first terminal 122b of the driving sub-circuit 122 and is connected with the second node N2. A second electrode of the first transistor T1 serves as a second terminal 122c of the driving sub-circuit 122 and is connected to the third node N3.

For example, as illustrated by FIG. 5B, the data writing sub-circuit 126 may be implemented as the second transistor T2. A gate electrode of the second transistor T2 is connected to the first scanning line (first scanning signal terminal Ga1) to receive the first scanning signal, a first electrode of the second transistor T2 is connected to the data line (data signal terminal Vd) to receive the data signal, and a second electrode of the second transistor T2 is connected to the first terminal 122b (second node N2) of the driving sub-circuit 122.

For example, as illustrated by FIG. 5B, the compensation sub-circuit 128 may be implemented as the third transistor T3. A gate electrode, a first electrode and a second electrode of the third transistor T3 respectively serve as the control electrode 128a, the first electrode 128b and the second electrode 128c of the compensation sub-circuit. The gate electrode of the third transistor T3 is configured to be connected to the second scanning line (second scanning signal terminal Ga2) to receive the second scanning signal, the first electrode T3s of the third transistor T3 is connected to the second electrode T1d (third node N3) of the first transistor T1, and the second electrode T3d of the third transistor T3 is electrically connected to the gate electrode T1g (first node N1) of the first transistor T1. For example, as illustrated by FIG. 2B, the storage sub-circuit 127 Can be implemented as the storage capacitor Cst, which includes a first capacitor electrode Ca and a second capacitor electrode Cb, the first capacitor electrode Ca is electrically connected to the first power supply voltage terminal VDD, and the second capacitor electrode Cb is electrically connected to the gate electrode T1g (first node N1) of the first transistor T1.

For example, as illustrated by FIG. 5B, the first light emitting control sub-circuit 123 may be implemented as the fourth transistor T4. A gate electrode of the fourth transistor T4 is connected to the first light emitting control line (first light emitting control terminal EM1) to receive the first light emitting control signal, a first electrode of the fourth transistor T4 is connected to the first voltage terminal VDD to receive the first power supply voltage, and a second electrode of the fourth transistor T4 is connected to the first terminal 122b (second node N2) of the driving sub-circuit 122.

For example, the light emitting element 121 is implemented as a light emitting diode (LED), such as an organic light emitting diode (OLED), a quantum dot light emitting diode (QLED) or an inorganic light emitting diode, such as a Micro LED or a micro OLED. For example, the light emitting element 121 may be a top emission structure, a bottom emission structure, or a double-sided emission junction. The light emitting element 121 can emit red light, green light, blue light or white light. Embodiments of the present disclosure do not limit the specific structure of the light emitting element.

For example, a first electrode 134 (e.g., anode) of the light emitting element 121 and a fourth node N4 are connected to the second terminal 122c of the driving sub-circuit 122 through the second light emitting control sub-circuit 124, and a second electrode 135 (e.g., cathode) of the light emitting element 121 is connected to the second power supply voltage VSS to receive the second power supply voltage VSS, which flows into the light emitting element 121 from the second terminal 122c of the driving sub-circuit 122 For example, the second power supply voltage terminal VSS may be grounded, that is, VSS may be 0V. For example, the second power supply voltage VSS may be a negative voltage.

For example, the second light emitting control sub-circuit 124 may be implemented as the fifth transistor T5. A gate electrode of the fifth transistor T5 is connected to the second light emitting control line (second light emitting control terminal EM2) to receive the second light emitting control signal, a first electrode of the fifth transistor T5 is connected to the second terminal 122c (third node N3) of the driving sub-circuit 122, and a second electrode of the fifth transistor T5 is connected to the first terminal 134 (fourth node N4) of the light emitting element 121.

For example, the first reset sub-circuit 125 may be implemented as the sixth transistor T6, and the second reset sub-circuit may be implemented as the seventh transistor T7. A gate electrode of the sixth transistor T6 is connected to the first reset control terminal Rst1 to receive the first reset control signal Rst1, a first electrode of the sixth transistor T6 is connected to the first reset voltage terminal Vinit1 to receive the first reset voltage Vinit1, and a second electrode of the sixth transistor T6 is connected to the first node N1. A gate electrode of the seventh transistor T7 is connected with the second reset control terminal Rst2 to receive the second reset control signal Rst2, a first electrode of the seventh transistor T7 is connected with the second reset voltage terminal Vinit2 to receive the second reset voltage Vinit2, and a second electrode of the seventh transistor T7 is connected with the fourth node N4.

It should be noted that all the transistors used in the embodiments of the present disclosure can be thin film transistors, field effect transistors or other switching devices with the same characteristics, and all the embodiments of the present disclosure take thin film transistors as examples. The source electrode and drain electrode of the transistor used here can be symmetrical in structure, so there can be no difference in structure between the source electrode and the drain electrode. In the embodiment of the present disclosure, in order to distinguish the two electrodes of the transistor except the gate electrode, it is directly described that one of the two electrodes is the first electrode and the other one of the two electrodes is the second electrode.

In addition, transistors can be divided into N-type and P-type transistors according to their characteristics. Upon the transistor being a P-type transistor, the turn-on voltage is a low-level voltage (for example, 0V, −5V, −10V or other suitable voltage), and the turn-off voltage is a high-level voltage (for example, 5V, 10V or other suitable voltage). Upon the transistor being an N-type transistor, the turn-on voltage is a high-level voltage (for example, 5V, 10V or other suitable voltage), and the turn-off voltage is a low-level voltage (for example, 0V, −5V, −10V or other suitable voltage). For example, as illustrated by FIG. 5B, the first to seventh transistors T1-T7 are all P-type transistors, such as low-temperature polysilicon thin film transistors. However, the embodiment of the present disclosure does not limit the type of transistors, and upon the type of transistor being changed, the connection relationship in the circuit can be adjusted accordingly.

Figure 5C:
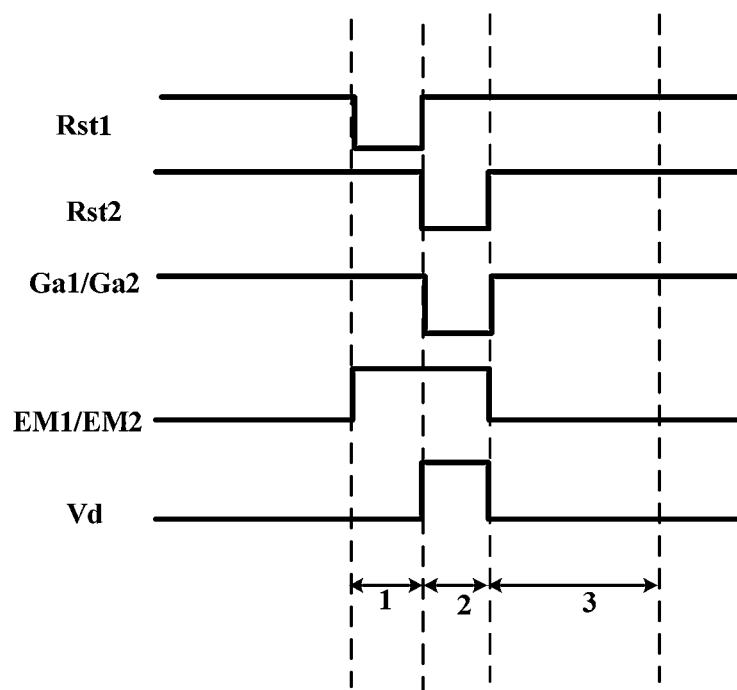
FIG. 5C is a timing signal diagram of a pixel circuit provided by at least one embodiment of the present disclosure.

The working principle of the pixel circuit shown in FIG. 5B will be described below with reference to the signal timing diagram shown in FIG. 5C. As illustrated by FIG. 5C, the display process of each frame image includes three stages, including an initialization stage 1, a data writing and compensation stage 2, and a light emitting stage 3.

As illustrated by FIG. 5C, in the present embodiment, the first scanning signal Ga1 and the second scanning signal Ga2 adopt the same signal, and the first light emitting control signal EM1 and the second light emitting control signal EM2 adopt the same signal. And the second reset control signal Rst2 has the same waveform as the first scanning signal Ga1/the second scanning signal Ga2, that is, the second reset control signal Rst2, the first scanning signal Ga1 and second scanning signal Ga2 can adopt the same signal. The first reset signal Rst1 of the current row of sub-pixels has the same waveform as the first scanning signal Ga1/the second scanning signal Ga2 of the previous row of sub-pixels, that is, the same signal is adopted. However, the present disclosure is not limited thereto. In other embodiments, different signals can be used as the first scanning signal Ga1, the second scanning signal Ga2, the first reset control signal Rst1 and the second reset control signal Rst2, and different signals can be used as the first light emitting control signal EM1 and the second light emitting control signal EM2.

In the initialization phase 1, the first reset control signal Rst1 is input to turn on the sixth transistor T6, and the first reset voltage Vinit1 is applied to the gate electrode of the first transistor T1, thereby resetting the first node N1.

In the data writing and compensation stage 2, the first scanning signal Ga1, the second scanning signal Ga2 and the data signal Vd are input, the second transistor T2 and the third transistor T3 are turned on, the data signal Vd is written into the second node N2 by the second transistor T2, and the first node N1 is charged through the first transistor T1 and the third transistor T3 until the potential of the first node N1 changes to Vd+Vth, where Vth is the threshold voltage of the first transistor T1. The potential of the first node N1 is stored in the storage capacitor Cst to be maintained, that is, the voltage information with the data signal and the threshold voltage Vth is stored in the storage capacitor Cst, which is used to provide grayscale display data and compensate the threshold voltage of the first transistor T1 in the light emitting stage.

In the data writing and compensation stage 2, the second reset control signal Rst2 may also be input to turn on the seventh transistor T7, and the second reset voltage Vinit2 is applied to the fourth node N4, thereby resetting the fourth node N4. For example, the reset of the fourth node N4 may also be performed in the initialization stage 1, for example, the first reset control signal Rst1 and the second reset control signal Rst2 may be the same. The embodiments of the present disclosure are not limited thereto.

In the light emitting phase 3, the first light emitting control signal EM1 and the second light emitting control signal EM2 are input to turn on the fourth transistor T4, the fifth transistor T5 and the first transistor T1, and the fifth transistor T5 applies a driving current to the OLED to make it emit light. The value of the driving current Id flowing through the OLED can be obtained according to the following formula:

$$Id = K(VGS - Vth)^2 = K[(Vdata + Vth - VDD) - Vth]^2 = K(Vdata - VDD)^2,$$

where k is the conductivity of the first transistor.

In the above formula, Vth represents the threshold voltage of the first transistor T1, VGS represents the voltage between the gate electrode and source electrode (here, the first electrode) of the first transistor T1, and K is a constant value related to the first transistor T1 itself. It can be seen from the above formula for calculating Id that the driving current Id flowing through OLED is no longer related to the threshold voltage Vth of the first transistor T1, so that compensation for the pixel circuit can be achieved, the problem that the threshold voltage of the driving transistor (the first transistor T1 in the embodiment of the disclosure) drifts due to the process and long-time operation is solved, and its influence on the driving current Id is eliminated, thereby improving the display effect of the display device using the same.

Hereinafter, the case where the voltage bus line 210 functions as a reset voltage bus line, and is configured to be connected with the reset sub-circuit of the sub-pixels in the first pixel rows to provide a reset voltage is exemplarily described as an example of the display substrate provided by the embodiment of the present disclosure, but the embodiments of the present disclosure are not limited thereto.

For example, the first voltage line 211 or the second voltage line 212 is respectively configured to be connected with the first terminals of the second reset sub-circuits in the sub-pixels in the first pixel row to provide the second reset voltage Vinit2. For example, the first reset voltage Vinit1 and the second reset voltage Vinit2 are the same voltage, and the reset voltage line 210 is configured to provide the first reset voltage Vinit1 to the first reset sub-circuits in the sub-pixels in the first pixel row and to provide the second reset voltage Vinit2 to the second reset sub-circuits in the sub-pixels in the first pixel row, respectively. However, embodiments of the present disclosure are not limited thereto.

The structure of the display substrate provided by at least one embodiment of the present disclosure will be exemplarily explained by taking the pixel circuit shown in FIG. 5B as an example, with reference to FIGS. 6A-6C, 7, 5, 6A-6C, 7, 8A-8C and 9.

Figure 6A:
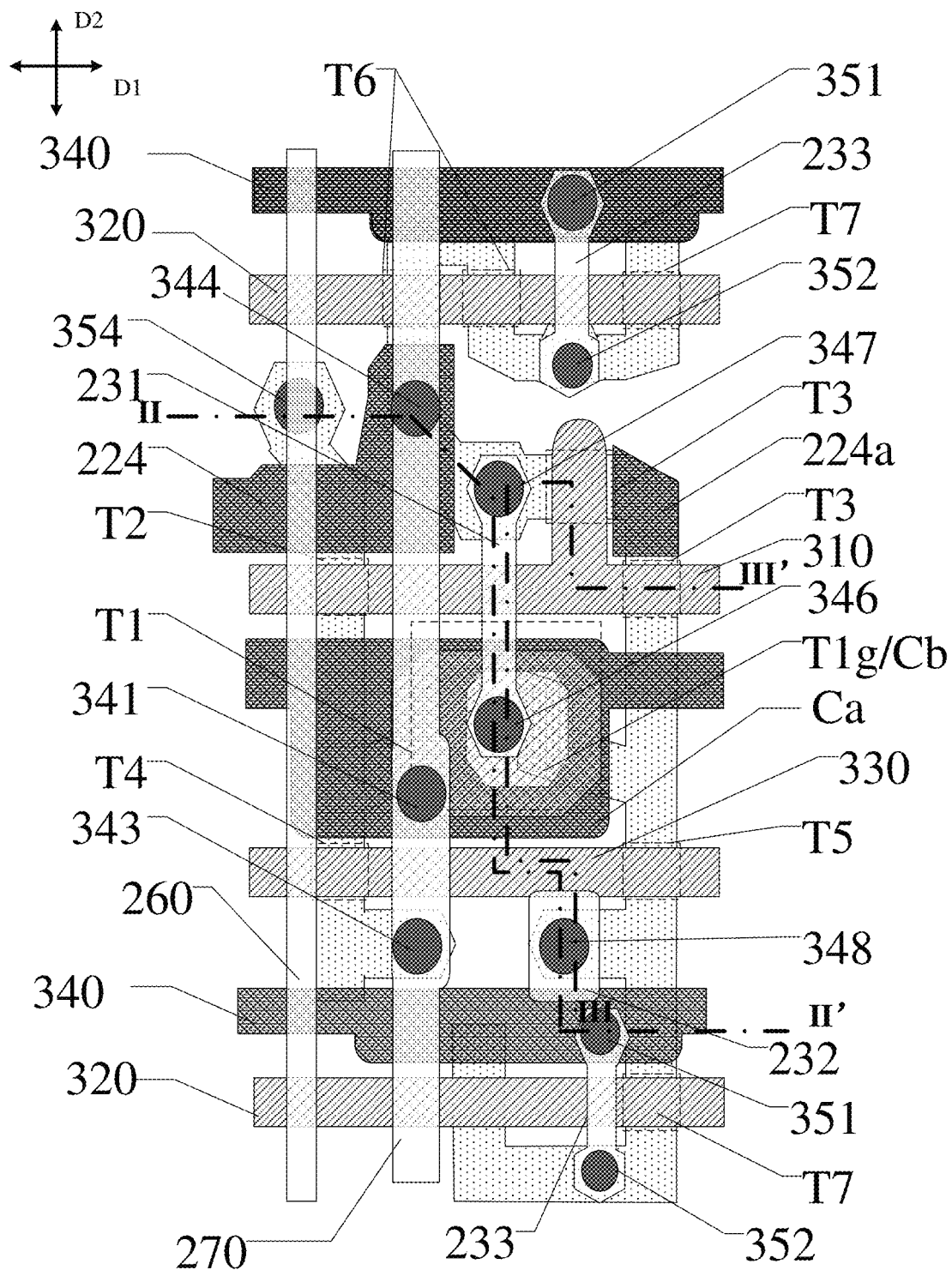
FIG. 6A is a fifth schematic diagram of a display substrate provided by at least one embodiment of the present disclosure.
Figure 6B:
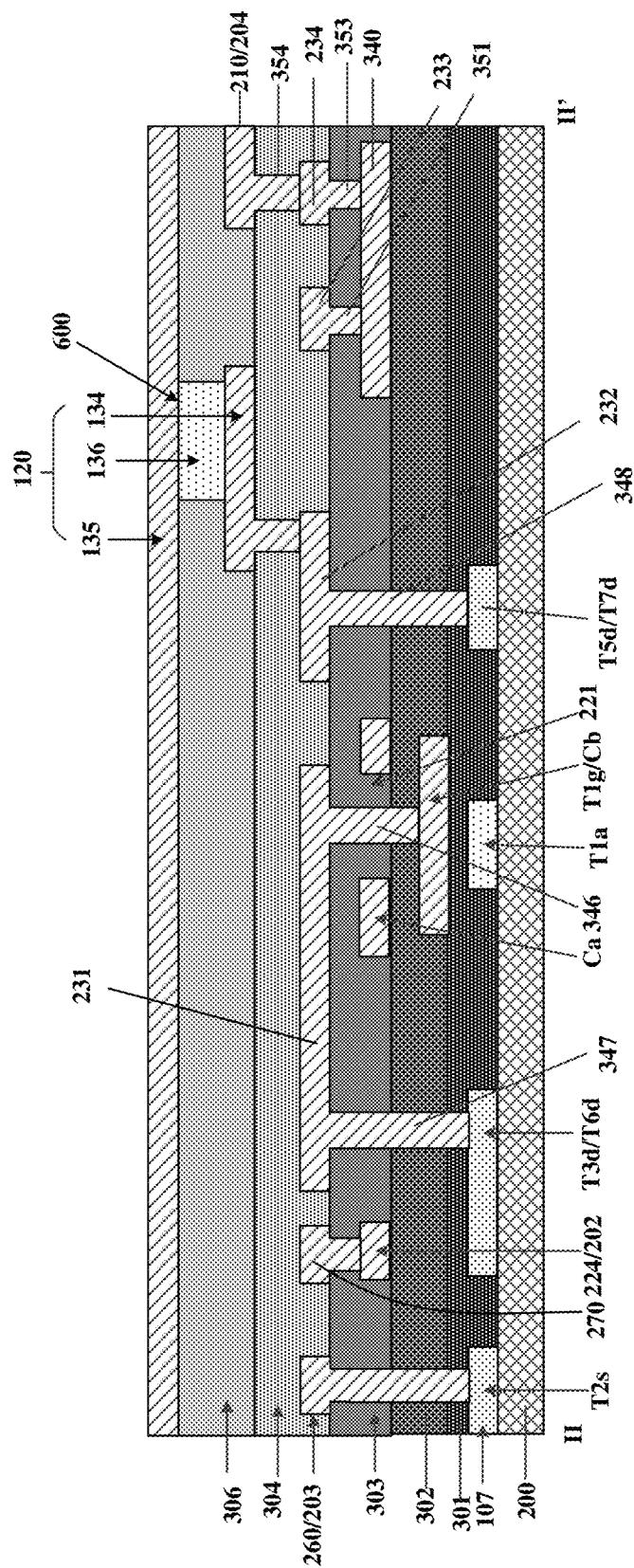
FIG. 6B is a sectional view of FIG. 1A taken along a section line II-II'.
Figure 6C:
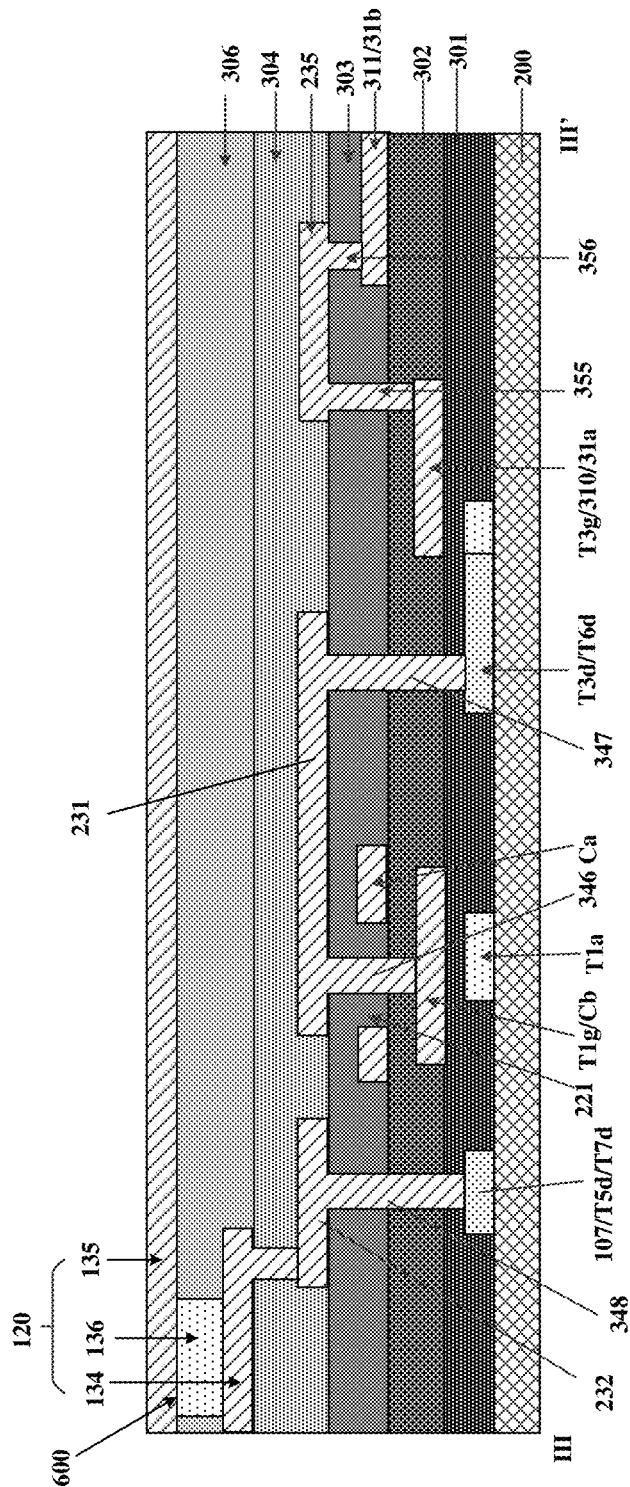
FIG. 6C is a sectional view of FIG. 1A taken along a section line.

FIG. 6A shows a schematic diagram of a pixel circuit 100 of a sub-pixel of a display substrate 20 provided by at least one embodiment of the present disclosure, FIG. 6B shows a cross-sectional view of FIG. 1A along the section line FIG. 6C shows a cross-sectional view of FIG. 1A along the section line and some structures without direct electrical connection at section lines are omitted in FIGS. 6B and 6C. FIG. 4 and FIG. 6A show the positions of section lines II-II' and correspondingly, that is, FIG. 6B also shows the sectional views of FIGS. 4 and 6A along section line and FIG. 6C also shows the sectional views of FIGS. 4 and 6A along the section line III-III'.

Referring to FIGS. 6A-6C, it can be seen that the display substrate 20 includes a semiconductor layer 107, a first insulating layer 301, a first conductive layer 201, a second insulating layer 302, a second conductive layer 202, a third insulating layer 303 and a third conductive layer 203 sequentially disposed on the base substrate 200.

Figure 7:
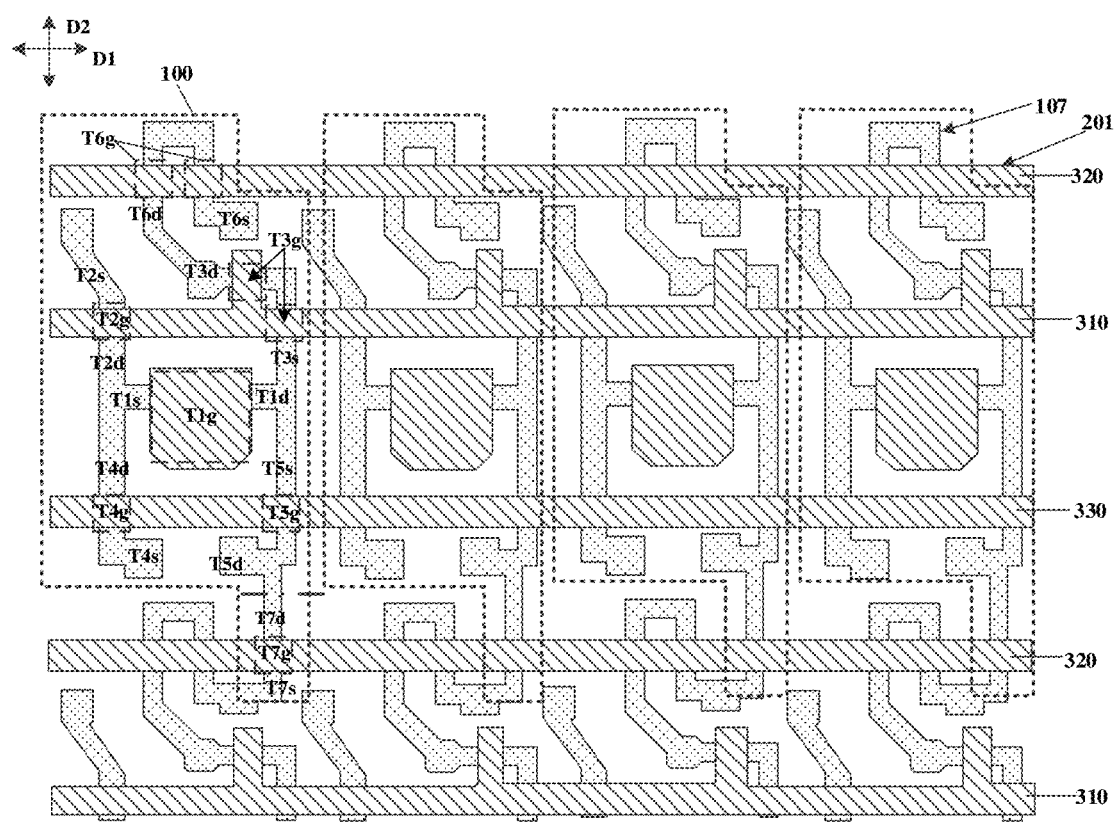
FIG. 7 is a sixth schematic diagram of a display substrate provided by at least one embodiment of the present disclosure.
Figure 8A:
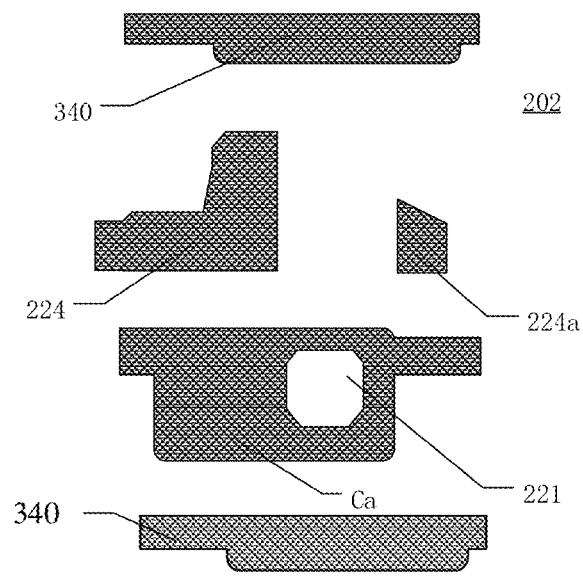
FIG. 8A is a seventh schematic diagram of a display substrate provided by at least one embodiment of the present disclosure.
Figure 8B:
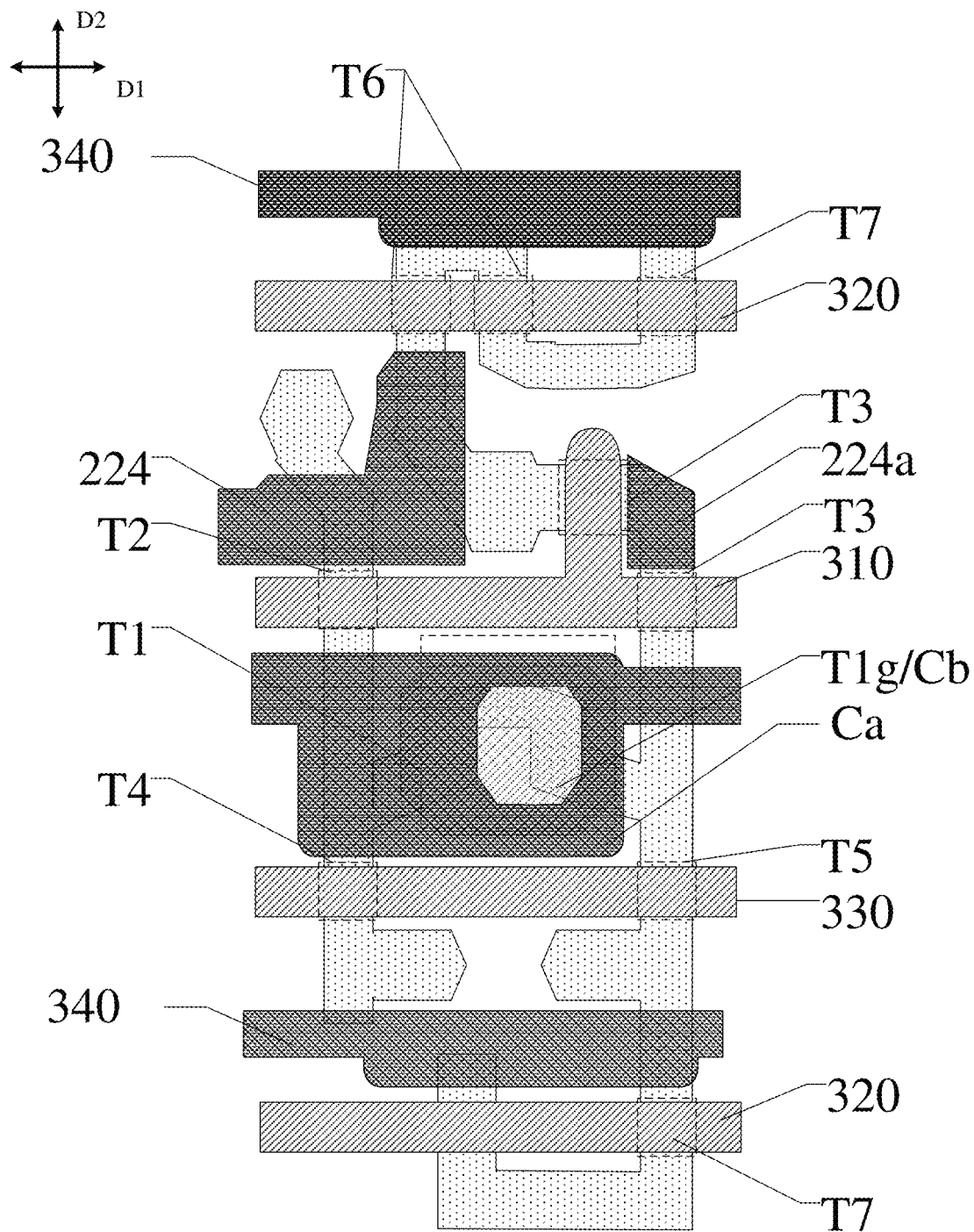
FIG. 8B is an eighth schematic diagram of the display substrate provided by at least one embodiment of the present disclosure.
Figure 9:
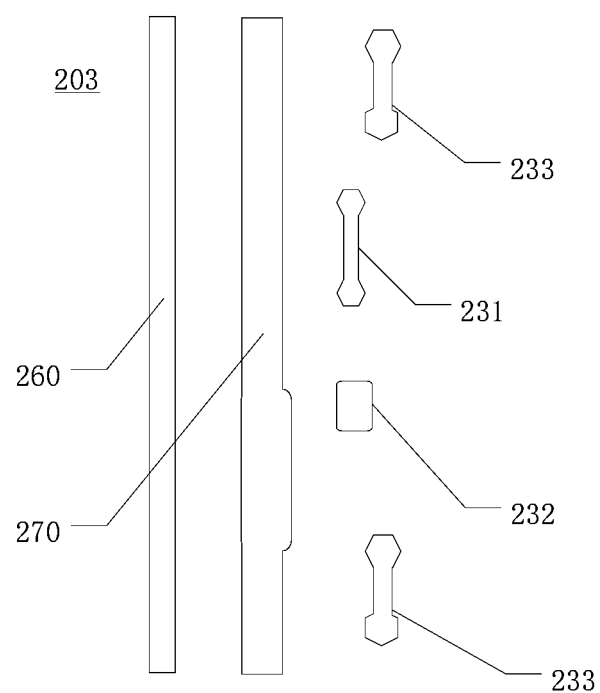
FIG. 9 is a ninth schematic diagram of a display substrate provided by at least one embodiment of the present disclosure.

The patterns of the semiconductor layer and the first conductive layer in each pixel circuit are the same. FIG. 7 schematically shows the semiconductor layer 107 and the first conductive layer (i.e. the gate layer) 201 of the transistors T1-T7 in the four pixel circuits adjacent in the first direction D1. FIG. 8A shows the second conductive layer 202 corresponding to FIG. 6A, and FIG. 8B shows the semiconductor layer 107, the first conductive layer 201 and the second conductive layer 202 corresponding to FIG. 6A. FIG. 9 shows the third conductive layer 203 corresponding to FIG. 6A.

For convenience of explanation, in the following description, Tng, Tns and Tnd are used to represent the gate electrode, the first electrode and the second electrode of the n-th transistor Tn, where n is 1-7.

It should be noted that "disposed in the same layer" in the present disclosure refers to a structure in which two (or more) structures are formed by the same deposition process and patterned by the same patterning process, and their materials can be the same or different. In the present disclosure, "integrated structure" refers to a structure in which two (or more) structures are connected with each other and formed by patterning the same film layer through the same patterning process, and their materials can be the same or different.

For example, as illustrated by FIG. 7, the first conductive layer 201 includes the gate electrodes of the transistors and some scanning lines and control lines. In FIG. 7, the region where each pixel circuit is located is shown by a large dashed line box, and the gate electrodes T1g-T7g of the first to seventh transistors T1-T7 in one pixel circuit are shown by small dashed line boxes.

The semiconductor layer 107 includes active layers T1a to T7a of the first to seventh transistors T1 to T7. As illustrated by FIG. 7, the active layers T1a-T7a of the first to seventh transistors T1-T7 are connected to each other as an integrated structure. For example, the semiconductor layers 107 in each row of sub-pixels have an integrated structure connected with each other, and the semiconductor layers in adjacent two rows of sub-pixels are spaced apart from each other.

For example, as illustrated by FIG. 7, the first conductive layer 201 includes gate electrodes T1g-T7g of first to seventh transistors T1-T7. For example, the display substrate 20 adopts a self-aligned process, and the semiconductor layer 107 is subjected to a conductive treatment (e.g., doping treatment) using the first conductive layer 201 as a mask, so that portions of the semiconductor layer 107 not covered by the first conductive layer 201 are conductive, so that portions of the active layers of each transistor located on both sides of the channel region are conductive to form the first and second electrodes of the transistor, respectively.

For example, the first conductive layer 201 further includes a plurality of scanning lines 310, a plurality of reset control lines 320 and a plurality of light emitting control lines 330 which are insulated from each other. For example, each row of sub-pixels is correspondingly connected with a scanning line 310, a reset control line 320 and a light emitting control line 330.

The scanning line 210 is electrically connected to (or integrated with) the gate electrodes of second transistors T2 in a corresponding row of sub-pixels to provide the first scanning signal Ga1, the reset control line 320 is electrically connected to the gate electrodes of sixth transistors T6 in a corresponding row of sub-pixels to provide the first reset control signal Rst1, and light emitting control line 330 is electrically connected to the gate electrodes of fourth transistors T4 in a corresponding row of sub-pixels to provide the first light emitting control signal EM1.

For example, as illustrated by FIG. 7, the gate electrodes of the seventh transistors T7 of the pixel circuits of the current row are electrically connected with the reset control line 320 corresponding to the pixel circuits of the next row (i.e., the pixel circuit row where the scanning line is sequentially turned on after the scanning line of the current row according to the scanning order of the scanning lines) to receive the second reset control signal Rst2.

For example, the first scanning signal Ga1 and the second reset control signal Rst2 may be the same signal, so that the scanning line 310 corresponding to the pixel circuits of the current row and the reset control line 320 corresponding to the pixel circuits of the next row may be connected to the same signal lead or the same signal terminal, which will be described in detail later.

For example, as illustrated by FIG. 7, the scanning line 310 is also electrically connected with the gate electrodes of the third transistors T3 to provide the second scanning signal Ga2, that is, the first scanning signal Ga1 and the second scanning signal Ga2 may be the same signal; the light emitting control line 330 is also electrically connected to the gate electrodes of the fifth transistors T5 to provide the second light emitting control signal EM2, that is, the first light emitting control signal EM1 and the second light emitting control signal EM2 are the same signal.

For example, as illustrated by FIGS. 8A-8B, the second conductive layer 202 includes a first capacitor electrode Ca. The first Capacitor electrode Ca overlaps with the gate electrode T1g of the first transistor T1 in the direction perpendicular to the base substrate 200 to form a storage capacitor Cst, that is, the gate electrode T1g of the first transistor T1 serves as the second capacitor electrode Cb of the storage capacitor Cst. For example, the first capacitor electrode Ca includes an opening 221, which exposes at least part of the gate electrode T1g of the first transistor T1, so that the gate electrode T1g can be electrically connected with other structures.

For example, as illustrated by FIGS. 8A-8B, the second conductive layer 202 may further include a plurality of reset voltage lines 340 extended along the first direction D1, and the plurality of reset voltage lines 340 are connected with a plurality of rows of sub-pixels in one-to-one correspondence. Each of the plurality of reset voltage lines 340 is electrically connected to the first electrodes of the sixth transistors T6 in a corresponding row of sub-pixels to provide the first reset voltage Vinit1.

For example, as illustrated by FIG. 8B, the first electrodes of the seventh transistors T7 in the current row of sub-pixels are electrically connected with the reset voltage line 340 corresponding to the next row of sub-pixels to receive the second reset voltage Vinit2, which will be described in detail later.

For example, as illustrated by FIGS. 8A-8B, the second conductive layer 202 may further include a shield electrode 224. For example, the shield electrode 224 overlaps with the first electrode T2s of the second transistor T2 in a direction perpendicular to the base substrate 200, so that the signal in the first electrode T2s of the second transistor T2 can be protected from interference by other signals. The first electrode T2s of the second transistor T2 is configured to receive the data signal Vd, and the data signal Vd determines the display gray scale of the sub-pixel, so the shielding electrode 224 improves the stability of the data signal, thereby improving the display performance.

For example, referring to FIG. 8B and FIGS. 6A-6B, the shield electrode 224 also at least partially overlaps with the second electrode T6d of the sixth transistor T6 in the direction perpendicular to the base substrate 200, so as to improve the stability of the signal in the second electrode T6d, thereby improving the stability of the sixth transistor T6 and further stabilizing the gate voltage of the first transistor T1.

For example, referring to FIG. 6A, the shield electrode 224 includes a portion 224a extended to the adjacent pixel circuit, which at least partially overlaps with the active layer of the third transistor T3 in the adjacent pixel circuit in the direction perpendicular to the base substrate 200, so as to improve the stability of the third transistor T3 and further stabilize the gate voltage of the first transistor T1.

For example, the shield electrode 224 is configured to be loaded with a fixed voltage; for example, the shield electrode 224 is electrically connected with the power supply line in the third conductive layer to load the pixel power supply voltage VDD, which will be described in detail later with reference to FIGS. 7 and 3.

For example, as illustrated by FIG. 9, the third conductive layer 203 includes a plurality of power supply lines 270 extended along the second direction D2. For example, the plurality of power supply lines 210 are electrically connected to the pixel circuits in a one-to-one correspondence to provide the first power supply voltage VDD.

With reference to FIG. 6A, the power supply line 210 is electrically connected with the first capacitor electrode Ca in a corresponding column of pixel circuits 100 through a via hole 341, and the power supply line 270 is also electrically connected with the first electrode T4s of the fourth transistor T4 through a via hole 343. The power supply line 270 is also electrically connected with the shield electrode 224 through the via hole 344, so that the shield electrode 224 has a fixed potential, and the shielding ability of the shield electrode is improved. For example, the via hole 341 and the via hole 344 all pass through the third insulating layer 303, and the via hole 343 passes through the first insulating layer 301, the second insulating layer 302 and the third insulating layer 303.

For example, referring to FIGS. 6A and 6C, the third conductive layer 303 further includes a plurality of data lines 260 extended along the second direction D2, for example, the plurality of data lines 260 are electrically connected with a plurality of columns of sub-pixels. For example, the data line 260 is electrically connected to the first electrode T2s of the second transistor T2 through the via hole 354.

For example, referring to FIGS. 9 and 6A-6C, the third conductive layer 203 further includes a connection electrode 231, one end of the connection electrode 231 is electrically connected with the gate electrode T1g of the first transistor T1, i.e., the second capacitor electrode Cb, through an opening 221 in the first capacitor electrode Ca and a via hole 346 in the insulating layer, and the other end of the connection electrode 231 is electrically connected with the second electrode T3d of the third transistor T3 through a via hole 347, thereby connecting the second capacitor electrode Cb with the third transistor T3. For example, the via hole 346 passes through the second insulating layer 302 and the third insulating layer 303. For example, the via hole 347 passes through the first insulating layer 301, the second insulating layer 302 and the third insulating layer 303.

For example, referring to FIGS. 9 and 6A-6C, the third conductive layer 203 further includes a connection electrode 232 electrically connected to the second electrode T5d of the fifth transistor T5 through a via hole 348, and used for electrically connecting the second electrode T5d of the fifth transistor t5 with the first electrode 134 of the light emitting element. For example, the via hole 348 passes through the first insulating layer 301, the second insulating layer 302 and the third insulating layer 303.

For example, referring to 8C and FIGS. 6A-6B, the third conductive layer 203 further includes a connection electrode 233, one end of the connection electrode 233 is electrically connected with the reset voltage line 340 through a via hole 351, and the other end of the connection electrode 233 is electrically connected with the first electrode T6s of the sixth transistor T6 through a via hole 352, so that the first electrode T6s of the sixth transistor T6 can receive the first reset voltage Vinit1 from the reset voltage line 340. For example, the via hole 351 passes through the third insulating layer 303. For example, the via hole 352 passes through the first insulating layer 301, the second insulating layer 302 and the third insulating layer 303.

For example, as illustrated by FIG. 6A, the first electrode of the seventh transistor T7 in the previous row of sub-pixels is electrically connected with the reset voltage line 340 corresponding to the current row of sub-pixels to receive the second reset voltage Vinit2. That is, the first reset sub-circuit (i.e., the sixth transistor T6) of the current row and the second reset sub-circuit (i.e., the seventh transistor T7) of the previous row receive the reset voltage through the same reset voltage line 340.

For example, as illustrated by FIGS. 6B-6C, the display substrate 20 may further include a fourth insulating layer 304 and a fourth conductive layer 204 sequentially located on the third conductive layer 203. For example, the fifth conductive layer 205 includes the first electrode 134 of the light emitting element 121.

For example, referring to FIG. 4 and FIG. 6B, the display substrate 20 further includes a connection electrode 234 located in the third conductive layer 203, and the connection electrode 234 is located in the peripheral region 23. The fourth conductive layer 204 further includes the voltage bus line 210. The connecting electrode 234 is electrically connected with the reset voltage line 340 through the via hole 353 and the voltage bus line 210 through the via hole 354, thereby electrically connecting the reset voltage line 340 with the voltage bus line 210. That is, in the first display region A1 or the second display region A2, the reset voltage line 340 is divided into two portions, which respectively serve as the first voltage line 211 in the first display region A1 and the second voltage line 212 in the second display region A2, and the two portions of the reset voltage line 340 are respectively electrically connected with the voltage bus line 210. For example, in the third display region A3 and the fourth display region A4, the reset voltage line 340 continuously extends in one row.

Because the fourth conductive layer 204 is mainly used to form the first electrode of the light emitting element, and the wiring density is low, it is convenient to arrange the voltage bus line 210 on the fourth conductive layer.

For example, referring to FIGS. 6B-6C, the display substrate 20 may further include a pixel defining layer 306 located at a side of the first electrode 134 of the light emitting element away from the base substrate 200. An opening formed in that pixel define layer 306 expose at least part of the first electrode 134 to define an opening region (i.e., a light emitting region) 600 of each sub-pixel of the display substrate. The light emitting layer 136 of the light emitting element 121 is formed at least in the opening (the light emitting layer 136 may also cover part of the surface of the pixel defining layer on the side away from the first electrode of the light emitting element), and the second electrode 135 is formed on the light emitting layer 136 to form the light emitting element 121. For example, the second electrode 135 is a common electrode, which is disposed on the display substrate 20 as a whole. For example, the first electrode 134 is the anode of the light emitting element, and the second electrode 135 is the cathode of the light emitting element.

For example, the base substrate 200 may be a rigid substrate, such as a glass substrate, a silicon substrate, etc., or may be formed of a flexible material having excellent heat resistance and durability, such as polyimide (PI), polycarbonate (PC), polyethylene terephthalate (PET), polyethylene, polyacrylate, polyarylate, polyetherimide, polyethersulfone, polyethylene terephthalate (PET), polyethylene (PE), polypropylene (PP), polysulfone (PSF), polymethylmethacrylate (PMMA), Cellulose triacetate (TAC), cycloolefin polymer (COP) and cycloolefin copolymer (COC).

For example, the material of the semiconductor layer 107 include but is not limited to a silicon-based material (amorphous silicon a-Si, polysilicon p-Si, etc.), metal oxide semiconductors (IGZO, ZnO, AZO, IZTO, etc.), and organic materials (hexathiophene, polythiophene, etc.).

For example, the materials of the first to fourth conductive layers may include a metal or an alloy of metals selected from the group consisting of gold (Au), silver (Ag), copper (Cu), aluminum (Al), molybdenum (Mo), magnesium (Mg) and tungsten (W), or a transparent conductive metal oxide material, such as indium tin oxide (ITO), indium zinc oxide (IZO), zinc oxide (ZnO), aluminum zinc oxide (AZO), etc.

For example, the light emitting element 121 has a top emission structure, and the first electrode 134 is reflective and the second electrode 135 is transmissive or semi-transmissive. For example, the first electrode 134 is a material with high work function to serve as an anode, for example, an ITO/Ag/ITO laminated structure; the second electrode 135 is a material with low work function to serve as a cathode, for example, a semi-transmissive metal or a metal alloy material, for example, an Ag/Mg alloy material.

For example, the first insulating layer 301, the second insulating layer 302, and the third insulating layer 303 are inorganic insulating layers, such as silicon oxide, silicon nitride, and silicon oxynitride, silicon nitride, or silicon oxynitride, or aluminum oxide, titanium nitride, and other insulating materials including metal oxynitride. For example, the fourth insulating layer 304 and the pixel defining layer 306 can be organic insulating materials, such as polyimide (PI), acrylate, epoxy resin, polymethylmethacrylate (PMMA), etc. For example, the fourth insulating layer 304 is a planarization layer. The embodiments of the present disclosure are not limited thereto.

For example, the portions of the first signal line 31 located in the display region, namely the first signal line sub-portion 318 and the second signal line sub-portion 319 are the scanning lines 310.

For example, the portions of the second signal line 32 located in the display region, namely, the first signal line sub-portion 321 or the second signal line sub-portion 322 is the power supply line 270, that is, the second signal line is configured to provide the first power supply voltage VDD.

For example, the portions of the third signal line 33 located in the display region, namely, the first signal line sub-portion 331 or the second signal line sub-portion 332 is the data line 260, that is, the third signal line is configured to provide the data signal Vd. For example, the second signal line 32 and the third signal line 33 are located in the third conductive layer 203 and insulated from each other.

Referring to FIG. 7, the first signal line sub-portion 318 and the second signal line sub-portion 319 are respectively electrically connected with the control terminal of the data writing sub-circuit (i.e., the gate electrode T2g of the second transistor T2) and the control terminal of the compensation sub-circuit (i.e., the gate electrode T3g of the third transistor T3) of the corresponding row of sub-pixels.

Referring to FIG. 5, the first signal line sub-portion 318 and the second signal line sub-portion 319 are respectively electrically connected with the control terminal of the data writing sub-circuit (i.e., the gate electrode T2g of the second transistor T2) and the control terminal of the compensation sub-circuit (i.e., the gate electrode T3g of the third transistor T3) of the corresponding row of sub-pixels.

For example, as illustrated by FIGS. 4 and 6C, the first signal line sub-portion 318 and the second signal line sub-portion 319 of the first signal line 31 are located in the first conductive layer 201, and are located in a different layer from the second signal line portion 31b. For example, the first signal line sub-portion 318 and the second signal line sub-portion 319 are located at a side of the second signal line portion 31b close to the base substrate 200.

Because the first signal line sub-portion 318 and the second signal line sub-portion 319 are configured as scanning lines in the display region, for example, they are integrally formed with the gate electrodes of the transistors in the display region, and the gate electrode process affects the channel width-length ratio of the transistors, thus, the adjustment of the gate electrode process has a great influence on the performance of the transistors. By arranging the second signal line portion 31b in a conductive layer different from the first signal line sub-portion 318 and the second signal line sub-portion 319, the process adjustment of the second signal line portion 31b can be more flexible, and the process adjustment of the second signal line portion 31b will not affect the processes of the first signal line sub-portion 318 and the second signal line sub-portion 319. For example, in the third display region A3 and the fourth display region A4, the scanning lines 310 are continuously formed. For example, the process parameters of the first signal line sub-portion 318 and the second signal line sub-portion 319 are consistent with those of the scanning line 310 in the third display region A3 and the fourth display region A4.

For example, as illustrated in FIG. 6C, the second signal line portion 31b is located in the second conductive layer 202, that is, the second signal line portion 31b and the reset voltage line 340 are disposed in the same layer and insulated from each other.

For example, as illustrated by FIG. 4 and FIG. 6C, the display substrate 20 further includes a connection electrode 235 (an example of the first connection electrode in the present disclosure), which is located in the third conductive layer 203, for example. The connecting electrode 235 is electrically connected with the first signal line sub-portion 318 or the second signal line sub-portion 319 (i.e., the scanning line 310) of the first signal line 31 through a via hole 355 (an example of the second via hole in the present disclosure), and is electrically connected with the second signal line portion 31b (the first extension portion 311 in FIG. 4) of the first signal line 31 through a via hole 356. The connection electrode 235 is provided to connect the first signal line portion 31a and the second signal line portion 31b, that is, the first signal line portion 31a and the second signal line portion 31b are not electrically connected directly through the via hole passing through the second insulating layer 302, thereby saving a patterning process on the second insulating layer 302.

For example, as illustrated by FIG. 4, the via hole 355 and the via hole 356 are located at a side of the voltage bus line 210 away from the transparent region 22, i.e., the side close to the display region 21, and are disposed in parallel in the second direction D2.

As illustrated by FIG. 4, the voltage bus line 210 is located at a side of the bent portion 313 of the second signal line portion 31b away from the transparent region 22, and is overlapped with the first extension portion 311 of the second signal line portion 31b in the direction perpendicular to the base substrate, but is not overlapped with the bent portion 313 of the second signal line portion 31b in the direction perpendicular to the base substrate. This arrangement allows the voltage bus line 210 to avoid the winding region with dense wires, which facilitates the electrical connection between the voltage bus line 210 and the first voltage line 211 or the second voltage line 212.

For example, as illustrated by FIG. 4, the display substrate also includes a connection electrode 236 in the third conductive layer 203, and a signal line sub-portion 316 (an example of the fourth signal line sub-portion in the present disclosure) in the peripheral region 23, the connection electrode 236 is located at a side of the signal line sub-portion 316 away from the transparent region and is used to connect the signal line sub-portion 316 with a reset control line 320 in the display region (an example of the third signal line sub-portion in the present disclosure). For example, the signal line sub-portion 316 is located in the third conductive layer 203, and the arrangement of the connection electrode 236 has a similar effect with the connection electrode 235, that is, saving a patterning process on the second insulating layer 302. For example, as illustrated by FIG. 4, the connection electrode 236 is partially overlapped with the voltage bus line 210 in the direction perpendicular to the base substrate.

Similarly, the reset control line 320 and the signal line sub-portion 316 in the display region are not disposed in the same layer, which facilitates adjusting the process of the signal line sub-portion 316 and avoids affecting the process of transistors in the display region.

For example, as illustrated by FIG. 2C, the scanning signals Ga1/Ga2 received by the pixel circuit in the current row and the second reset control signal Rst2 received by the pixel circuit in the current row may be the same signal, and the first reset control signal Rst1 connected correspondingly to the pixel circuits in the next row is the same signal. Therefore, the scanning line 320 connected correspondingly to the pixel circuits in the current row is connected with the reset control line 320 connected correspondingly to the second reset sub-circuits in the current row (that is, the reset control line 320 connected correspondingly to the first reset sub-circuits in the next row)

With reference to FIG. 4, for the first pixel row, the scanning line 310 (i.e., the first signal line sub-portion 318 or the second signal line sub-portion 319) corresponding to the pixel circuits of the current row and the reset control line 320 correspondingly connected with the second reset sub-circuits are connected to the same winding line (i.e., the bent portion 313), that is, the scanning line 310 and the reset control line 320 share one winding line, which can reduce the density of winding lines in the peripheral region 23 and improve the process yield. As illustrated by FIG. 4, the scanning line 310 is connected to the bent portion 313 through the first extension portion 311 of the second signal line portion 31b, and the reset control line 320 is connected to the bent portion 313 through the signal line sub-portion 316, that is, one end of the signal line sub-portion 316 is electrically connected with the reset control line 320, and the other end of the signal line sub-portion 316 is electrically connected with the corresponding bent portion 313. The signal line sub-portion 316 is parallel to the first extension portion 311 in the same layer, and is directly electrically connected with the bent portion 313. FIG. 4 shows a connection point C1 connecting the first extension portion 311 and the bent portion 313 of the second signal line portion of the first signal line and a connection point C2 connecting the signal line sub-portion 316 and the bent portion 313, respectively. The bent portion 313 includes portions located at the connection point C1 and the connection point C2.

For example, the display substrate 20 includes a plurality of signal line sub-portions 316 extended along the first direction D1, and the plurality of signal line sub-portions 316 are electrically connected to a plurality of reset control lines 320 corresponding to the plurality of first pixel rows, respectively.

As illustrated by FIG. 4, in the direction perpendicular to the base substrate, each signal line sub-portion 316 is overlapped with the voltage bus line 210.

For example, as illustrated by FIG. 4 and FIG. 6A, the second signal line 32 (power supply line 270) and the third signal line 33 (data line 260) connected to the same subpixel are directly adjacent in the second direction D2 and disposed in pairs.

For example, the plurality of second signal lines 32 and the plurality of third signal lines 33 are alternately disposed in the first direction in both the display region and the peripheral region.

For example, the average line width of the first signal line portion of the second signal line 32 is larger than that of the second signal line portion of the second signal line 32. That is, the second signal line 32 is narrowed from the display region to the peripheral region. For example, the average line width of the first signal line portion of the second signal line 32 is larger than the average line width of the second signal line sub-portion 322 of the second signal line portion. Allowing the second signal line 32 to be wider in the display region helps to reduce the resistance of the second signal line 32, thus reducing the voltage drop of the power supply voltage on the second signal line 32 and improving the display uniformity, while allowing the line width of the second signal line portion of the second signal line to be narrow helps to save space for winding in the peripheral region. For example, the average line width of the second signal line sub-portion 322 of the second signal line portion of the second signal line is the same as that of the second signal line sub-portion 332 of the second signal line portion of the third signal line, thereby reducing the process difficulty.

For example, as illustrated by FIGS. 1A-1C, the display substrate further includes a dummy electrode 220, which is a floating electrode, that is, no electrical signal is applied on the dummy electrode 220. For example, at least part of the dummy electrode 220 is disposed around the transparent region 22 and is closest to the transparent region 22 compared with other conductive lines, that is, a side of the dummy electrode close to the transparent region 22 is not provided with signal lines, or the dummy electrode is the conductive structure closest to the transparent region 22 in the peripheral region 23. The dummy electrode 220 can shield the electric signal on the signal lines in the display region 21 and the peripheral region 23 from the interference of the photoelectric signal in the transparent region 22. For example, the transparent region 22 is configured to allow light from the display side of the display substrate to be transmitted to the opposite side of the display side for sensing, for example, the light is visible light or infrared light. The dummy electrode 220 can shield the interference of light passing through the transparent region 22 on the electrical signal outside the dummy electrode. For example, the dummy electrode may be annular and completely surround the transparent region 22.

For example, the dummy electrode 220 can be located in the third conductive layer 203. Because the data line 260 is located in the third conductive layer, providing the dummy electrode 220 in the third conductive layer 203 can shorten the distance between the dummy electrode 220 and the data line 260 and protect the data signal in the data line 260 from interference. However, the embodiments of the present disclosure are not limited thereto. In other examples, the dummy electrode 220 may also be located in the second conductive layer 202 or the fourth conductive layer 204.

For example, there is no conductive structure in the transparent region 22, and all or part of the first to fourth insulating layers can be reserved in the transparent region 22. By adjusting the thickness of the insulating layers in the transparent region, the optical path of light passing through the transparent region 22 can be adjusted according to actual needs.

Figure 10A:
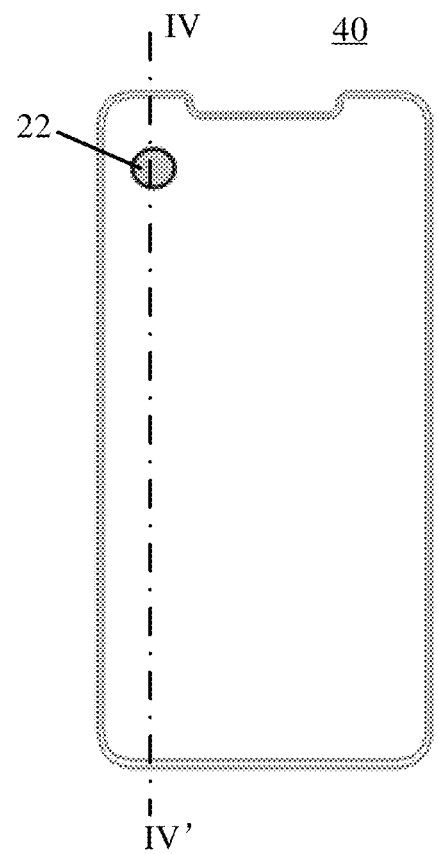
FIG. 10A is a schematic diagram of a display device provided by at least one embodiment of the present disclosure.

At least one embodiment of the present disclosure also provides a display device, which includes any one of the above display substrates 20 and a sensor. FIG. 10A shows a structural schematic diagram of a display device 40 provided by some embodiments of the present disclosure, and FIG. 10B is a sectional view taken along the section line IV-IV' in FIG. 10A.

Figure 10B:
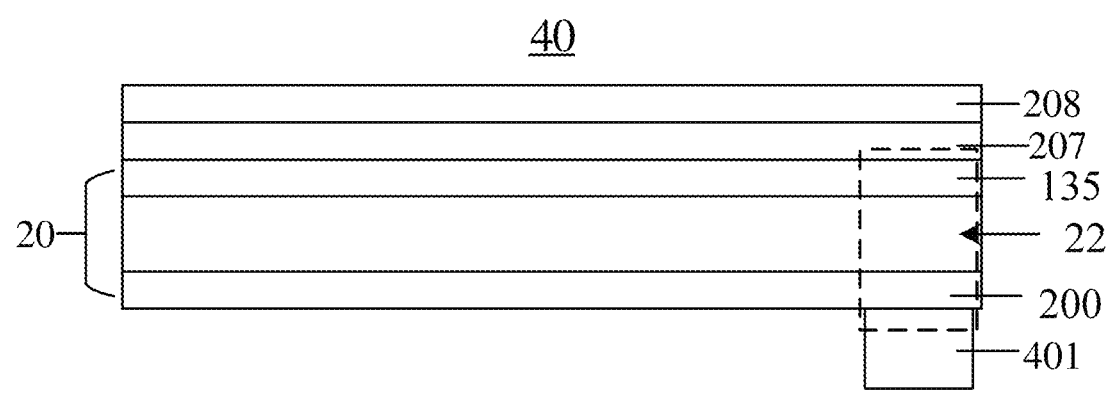
FIG. 10B is a sectional view of FIG. 10A taken along a section line IV-IV'.

As illustrated by FIGS. 10A-10B, the sensor 401 is correspondingly disposed in the third display region 23 of the display substrate 20 and is disposed on the side of the display substrate 20 opposite to the display side, for example, located at a side of the base substrate 200 away from the light emitting elements. The sensor 401 is, for example, a photoelectric sensor configured to receive light from the first side of the display substrate and convert the light into an electrical signal for forming an image. For example, the light reaches the sensor from the display side through the transparent region 22, for example, the light is visible light or infrared light.

For example, the display device 40 further includes a package layer 207 and a cover plate 208 disposed on the display substrate 20. The package layer 207 is configured to seal the light emitting elements in the display substrate 20 to prevent external moisture and oxygen from penetrating into the light emitting elements and the driving circuit to cause damage to the devices. For example, the package layer 207 includes an organic thin film or a structure in which organic thin films and inorganic thin films are alternately stacked. For example, a water absorbing layer (not shown) may also be disposed between the package layer 207 and the display substrate 20, which is configured to absorb water vapor or sol remaining in the previous manufacturing process of the light emitting element. The cover plate 208 is, for example, a glass cover plate. For example, the cover plate 208 and the package layer 207 may have an integral structure.

For example, the sensor 401 may be attached to the back surface (the surface opposite to the display surface) of the display substrate 20. As illustrated by FIG. 10B, the imaging element 401 is attached to the side of the base substrate 200 away from the second electrode 135 of the light emitting element. The sensor 401 can be implemented as a camera, for example.

The display device can be, for example, a digital photo frame, a smart bracelet, a smart watch, a mobile phone, a tablet computer, a display, a notebook computer, a navigator and other products or components with any display function.

The foregoing merely are exemplary embodiments of the disclosure, and not intended to define the scope of the disclosure, and the scope of the disclosure is determined by the appended claims.

What is claimed is:

1. A display substrate, comprising a display region, a transparent region and a peripheral region between the display region and the transparent region,
   wherein the display substrate comprises a base substrate and a plurality of sub-pixels on the base substrate and in the display region, the plurality of sub-pixels are distributed in a plurality of pixel rows and a plurality of pixel columns along a first direction and a second direction, and the first direction and the second direction are different; the plurality of pixel rows comprise a plurality of first pixel rows separated by the transparent region;
   the display substrate further comprises a voltage bus line in the peripheral region, the voltage bus line at least partially surrounds the transparent region, and is configured to be connected with sub-pixels in the plurality of first pixel rows to provide a first voltage;
   the display substrate further comprises a plurality of first signal lines extended along the first direction, and the plurality of first signal lines are respectively connected with the plurality of first pixel rows in one-to-one correspondence;
   each of the plurality of first signal lines comprises a first signal line portion in the display region and a second signal line portion in the peripheral region, the second signal line portion is electrically connected with the first signal line portion, and the second signal line portion comprises a bent portion extended along the transparent region;
   bent portions of second signal line portions of the plurality of first signal lines are all located at a side of the voltage bus line close to the transparent region;
   the display substrate further comprises a plurality of second signal lines extended along the second direction, and each of the plurality of second signal lines comprises a first signal line portion in the display region and a second signal line portion in the peripheral region; and
   an average line width of the first signal line portion of the second signal line is greater than an average line width of the second signal line portion of the second signal line;
   the first signal line portion of each of the plurality of first signal lines comprises a first signal line sub-portion in a first display region and a second signal line sub-portion in a second display region, and the second signal line portion of each of the plurality of first signal lines electrically connects the first signal line sub-portion and the second signal line sub-portion of the each first signal line;

the first signal line sub-portion and the second signal line sub-portion of each of the plurality of first signal lines are both extended along the first direction, the first signal line sub-portion is connected with sub-pixels located in the first display region in a first pixel row corresponding to the each first signal line, and the second signal line sub-portion is connected with sub-pixels located in the second display region in the first pixel row corresponding to the each first signal line;

the display substrate further comprises a plurality of first connection electrodes, and the plurality of first connection electrodes are at a side of the second signal line portions of the plurality of first signal lines away from the base substrate and are corresponding to the plurality of the first signal lines respectively;

the first signal line sub-portion and the second signal line portion of each of the plurality of first signal lines are electrically connected through a first connection electrode corresponding to the each first signal line;

the first connection electrode is electrically connected with the first signal line sub-portion of the corresponding first signal line through a first via hole and electrically connected with the second signal line portion of the corresponding first signal line through a second via hole.

2. The display substrate according to claim 1, wherein the display region comprises the first display region and the second display region which are separated by the transparent region and are opposite in the first direction, and the sub-pixels in the plurality of first pixel rows are separated by the transparent region and in the first display region and the second display region;

the display substrate further comprises a plurality of first voltage lines and a plurality of second voltage lines extended along the first direction, and the plurality of first voltage lines and second voltage lines are all electrically connected with the voltage bus line;

the plurality of first voltage lines are in the first display region and are respectively connected with rows of sub-pixels, located in the first display region, in the plurality of first pixel rows to provide the first voltage;

the plurality of second voltage lines are in the second display region and are respectively connected with rows of sub-pixels, located in the second display region, in the plurality of first pixel rows to provide the first voltage.

3. The display substrate according to claim 2, wherein each of the plurality of sub-pixels comprises a light emitting element and a pixel circuit driving the light emitting element to emit light;

the pixel circuit comprises a driving sub-circuit, a data writing sub-circuit, a compensation sub-circuit, a storage sub-circuit and a reset sub-circuit;

the driving sub-circuit comprises a control terminal, a first terminal and a second terminal, and is configured to be connected with the light emitting element and control a driving current flowing through the light emitting element;

the data writing sub-circuit is connected with the first terminal of the driving sub-circuit and is configured to write a data signal into the first terminal of the driving sub-circuit in response to a first scanning signal;

the compensation sub-circuit comprises a control terminal, a first terminal and a second terminal, the control terminal of the compensation sub-circuit is configured to receive a second scanning signal, the first terminal and the second terminal of the compensation sub-circuit are electrically connected with the control terminal and the second terminal of the driving sub-circuit, respectively, and the compensation sub-circuit is configured to perform a threshold compensation on the driving sub-circuit in response to the second scanning signal;

the storage sub-circuit comprises a first terminal and a second terminal, the first terminal of the storage sub-circuit is configured to receive a first power supply voltage, and the second terminal of the storage sub-circuit is electrically connected with the control terminal of the driving sub-circuit;

the reset sub-circuit comprises a control terminal, a first terminal and a second terminal, the control terminal of the reset sub-circuit is configured to receive a reset control signal, the first terminal of the reset sub-circuit is connected with a corresponding first voltage line or a corresponding second voltage line to receive the first voltage, and the second terminal of the reset sub-circuit is connected with the light emitting element.

4. The display substrate according to claim 3, wherein the light emitting element comprises a first electrode, a second electrode and a light emitting layer between the first electrode and the second electrode, the first electrode is closer to the base substrate than the light emitting layer, and the voltage bus line and the first electrode of the light emitting element are in a same layer and insulated with each other.

5. The display substrate according to claim 3, wherein the storage sub-circuit comprises a storage capacitor comprising a first capacitor electrode and a second capacitor electrode, and the first capacitor electrode and the second capacitor electrode serve as the first terminal and the second terminal of the storage sub-circuit respectively;

the second capacitor electrode is at a side of the first capacitor electrode close to the base substrate; the first voltage line, the second voltage line and the first capacitor electrode of the storage capacitor are in a same layer and insulated from each other, and are located at a side of the voltage bus line close to the base substrate.

6. The display substrate according to claim 5, wherein the plurality of first signal lines are respectively connected with data writing sub-circuits of the sub-pixels of the plurality of first pixel rows in one-to-one correspondence to provide first scanning signals.

7. The display substrate according to claim 6, wherein for each of the plurality of first signal lines, the first signal line sub-portion and the second signal line sub-portion are in a same layer and are at a side of the second signal line portion of the each first signal line close to the base substrate.

8. The display substrate according to claim 6, wherein the second signal line portion of each first signal line further comprises a first extension portion and a second extension portion located at both sides of the bent portion of the each first signal line and electrically connected with the bent portion;

the first extension portion and the second extension portion of each first signal line are both extended along the first direction and are electrically connected with the first signal line sub-portion and the second signal line sub-portion of the each first signal line, respectively.

9. The display substrate according to claim 8, wherein the voltage bus line is overlapped with the first extension portion and the second extension portion of the second signal line portion in a direction perpendicular to the base substrate, and is not overlapped with the bent portion in the direction perpendicular to the base substrate.

10. The display substrate according to claim 8, further comprising a plurality of third signal line sub-portions located in the first display region and extended along the first direction,
wherein the plurality of third signal line sub-portions are respectively connected with control terminals of reset sub-circuits of rows of sub-pixels, located in the first display region, in the plurality of first pixel rows in one-to-one correspondence to provide reset control signals.

11. The display substrate according to claim 10, further comprising a plurality of fourth signal line sub-portions in the peripheral region,
wherein the plurality of fourth signal line sub-portions are electrically connected with the plurality of third signal line sub-portions in one-to-one correspondence,
each of the plurality of fourth signal line sub-portions is electrically connected with the bent portion of the second signal line portion of the first signal line connected with sub-pixels which are connected with a third signal line sub-portion corresponding to the each fourth signal line sub-portion;
one end of each fourth signal line sub-portion is electrically connected with a corresponding third signal line sub-portion, and the other end of the each fourth signal line sub-portion is electrically connected with one of the bent portions;
in a direction perpendicular to the base substrate, the voltage bus line is overlapped with each of the plurality of fourth signal line sub-portions.

12. The display substrate according to claim 5, wherein first signal line portions of the plurality of first signal lines and the first capacitor electrode are located in a same layer and insulated from each other,
the second signal line portions of the plurality of first signal lines and the second capacitor electrode are located in a same layer and insulated from each other.

13. The display substrate according to claim 1, wherein the first via hole and the second via hole are located at a side of the voltage bus line away from the transparent region and disposed in parallel in the second direction.

14. The display substrate according to claim 1, further comprising a plurality of second connection electrodes,
wherein the plurality of second connection electrodes and the plurality of second signal lines are disposed in a same layer and insulated from each other, and the plurality of first voltage lines are respectively electrically connected with the voltage bus line through the plurality of second connection electrodes.

15. The display substrate according to claim 1, wherein the display substrate further comprises a plurality of first compensation electrodes located in the peripheral region, and the plurality of first compensation electrodes are respectively disposed in one-to-one correspondence with the plurality of first signal lines; the plurality of first compensation electrodes are located at a side of the second signal line portions of the plurality of first signal lines away from the base substrate;
each of the plurality of first compensation electrodes is overlapped with the bent portion of the second signal line portion of a corresponding first signal line in a direction perpendicular to the base substrate to form a compensation capacitor;
the plurality of first compensation electrodes are located at a side of the voltage bus line close to the transparent region.

16. A display device, comprising the display substrate according to claim 1.

17. The display device according to claim 16, further comprising a sensor, wherein the sensor is disposed at a side of the base substrate away from the plurality of sub-pixels and is configured to receive and detect light transmitted through the transparent region.

18. The display device according to claim 1, wherein the voltage bus line comprises a curve portion extended around the transparent region.

19. A display substrate, comprising a display region, a transparent region and a peripheral region between the display region and the transparent region,
wherein the display substrate comprises a base substrate and a plurality of sub-pixels on the base substrate and in the display region, the plurality of sub-pixels are distributed in a plurality of pixel rows and a plurality of pixel columns along a first direction and a second direction, and the first direction and the second direction are different; the plurality of pixel rows comprise a plurality of first pixel rows separated by the transparent region;
the display substrate further comprises a voltage bus line in the peripheral region, the voltage bus line at least partially surrounds the transparent region, and is configured to be connected with sub-pixels in the plurality of first pixel rows to provide a first voltage;
the display substrate further comprises a plurality of first signal lines extended along the first direction, and the plurality of first signal lines are respectively connected with the plurality of first pixel rows in one-to-one correspondence;
each of the plurality of first signal lines comprises a first signal line portion in the display region and a second signal line portion in the peripheral region, the second signal line portion is electrically connected with the first signal line portion, and the second signal line portion comprises a bent portion extended along the transparent region;
bent portions of second signal line portions of the plurality of first signal lines are all located at a side of the voltage bus line close to the transparent region;
the display substrate further comprises a dummy electrode, and the dummy electrode is at least partially around the transparent region and is closest to the transparent region compared with other conductive lines.

* * * * *